(12) United States Patent
Tsai et al.

(10) Patent No.: US 9,832,880 B2
(45) Date of Patent: Nov. 28, 2017

(54) ELECTRONIC APPARATUS AND METHOD FOR MANUFACTURING THE SAME

(71) Applicant: InnoLux Corporation, Miao-Li County, Taiwan (TW)

(72) Inventors: Chi-Che Tsai, Miao-Li County (TW); Yu-Yao Chen, Miao-Li County (TW); Po-Yun Hsu, Miao-Li County (TW); Wei-Yen Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 544 days.

(21) Appl. No.: 14/279,792

(22) Filed: May 16, 2014

(65) Prior Publication Data
US 2014/0362545 A1    Dec. 11, 2014

(30) Foreign Application Priority Data

Jun. 6, 2013 (TW) .............................. 102120101 A
Feb. 27, 2014 (TW) .............................. 103106686 A

(51) Int. Cl.
| | |
|---|---|
| B32B 7/06 | (2006.01) |
| B32B 38/10 | (2006.01) |
| G02F 1/1333 | (2006.01) |
| H01L 51/00 | (2006.01) |
| H05K 1/03 | (2006.01) |
| H05K 3/00 | (2006.01) |
| G02F 1/13 | (2006.01) |

(52) U.S. Cl.
CPC ............... *H05K 3/007* (2013.01); *B32B 7/06* (2013.01); *B32B 38/10* (2013.01); *B32B 2307/716* (2013.01); *B32B 2310/08* (2013.01); *G02F 1/1303* (2013.01); *G02F 1/133305* (2013.01); *H01L 51/003* (2013.01); *H01L 2251/5338* (2013.01); *H05K 1/0306* (2013.01); *H05K 1/0393* (2013.01); *H05K 2203/016* (2013.01); *Y10T 428/31678* (2015.04)

(58) Field of Classification Search
None
See application file for complete search history.

(56) References Cited

FOREIGN PATENT DOCUMENTS

| | | | |
|---|---|---|---|
| CN | 102468452 | | 5/2012 |
| JP | 2000243943 A | * | 9/2000 |
| TW | 200540474 A | | 12/2005 |
| TW | 201235738 A | | 9/2012 |

OTHER PUBLICATIONS

Machine translation of JP 2000-243943A, Sep. 2000.*

* cited by examiner

*Primary Examiner* — Ramsey Zacharia
(74) *Attorney, Agent, or Firm* — Bacon & Thomas, PLLC

(57) ABSTRACT

An electronic apparatus and a method for manufacturing the same are disclosed. The electronic device of the present invention comprises: a substrate with a first surface and a second surface; an electronic unit layer disposed on the first surface of the substrate; a residue layer disposed on the second surface of the substrate, wherein a material of the residue layer comprises: a compound containing at least one functional group selected from the group consisting of aryl, nitro and ketone.

18 Claims, 2 Drawing Sheets

ELECTRONIC APPARATUS AND METHOD FOR MANUFACTURING THE SAME

CROSS REFERENCE TO RELATED APPLICATION

This application claims the benefits of the Taiwan Patent Application Serial Number 102120101 and 103106686, respectively filed on Jun. 6, 2013 and Feb. 27, 2014, the subject matter of which is incorporated herein by reference.

BACKGROUND OF THE INVENTION

1. Field of the Invention

The present invention relates to an electronic apparatus and a method for manufacturing the same and, more particularly, to an electronic apparatus with a flexible substrate and a method for manufacturing the same.

2. Description of Related Art

As the demand for thin and light electronic devices, the glass substrate for the display panel is developed from a glass substrate having a thickness of about 0.4 mm toward a flexible substrate having a thickness of about 0.3 mm.

However, when the flexible substrate is a thin glass substrate having a thickness of 0.3 mm or less or a plastic substrate, the rigidity thereof is not high enough for the current used process. Therefore, it is hard to form display units thereon through the current used process for manufacturing the display panel.

In order to obtain the display panel with the flexible substrate manufactured through the current used process, the flexible substrate is loaded on another glass carrier to increase the rigidity thereof, and then the flexible substrate is separated from the glass carrier through a laser process when the process for manufacturing the display panel is finished.

However, the laser system is expensive, the selection of suitable wavelength is less, and the time for performing the laser process is long. Sometimes, the active units may be damaged, and the flexible plastic substrate may be yellowed and even carbonated when the energy of the laser is too high, resulting in the yield rate of the electronic products lowered.

Hence, it is desirable to provide a novel method for manufacturing an electronic apparatus to obviate the aforementioned problems that the flexible substrate cannot be directly applied on the current used machine for manufacturing the electronic apparatus.

SUMMARY OF THE INVENTION

An object of the present invention is to provide an electronic apparatus made with a flexible substrate.

Another object of the present invention is to provide a method for manufacturing an electronic apparatus, which can be used to produce a light and thin electronic apparatus on the current used machine.

To achieve the object, the method for manufacturing an electronic apparatus of the present invention comprises the following steps: (A) providing a carrier with a debonding layer formed thereon, wherein a material of the debonding layer comprises: a siloxane compound or a polyimide compound containing at least one selected from a group consisting of aryl, nitro and ketone; (B) disposing a substrate on the debonding layer to let the debonding layer locate between the substrate and the carrier, wherein the substrate has a first surface and a second surface corresponding to each other, and the second surface contacts the debonding layer; (C) forming an electronic unit layer on the first surface of the substrate; and (D) providing a radiation from a side of the carrier to separate the carrier from the substrate through a reaction of the material of the debonding layer to form an electronic apparatus, wherein the debonding layer is converted into a residue layer forming on the second surface of the substrate, and a material of the residue layer comprises: a compound containing at least one selected from a group consisting of aryl, nitro and ketone.

After performing the aforementioned method of the present invention, an electronic apparatus of the present invention is obtained, which comprises: a substrate with a first surface and a second surface corresponding to each other; an electronic unit layer disposed on the first surface of the substrate; and a residue layer disposed on the second surface of the substrate, wherein a material of the residue layer comprises: a compound containing at least one selected from a group consisting of aryl, nitro and ketone.

In the method for manufacturing the electronic apparatus of the present invention, the material of the debonding layer may comprise: at least one compound represented by the following formula (I) or (II):

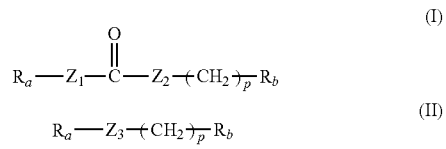

wherein $Z_1$ is selected from a group consisting of O, S, N, $C(R_c)_2$, and a bond;

$Z_2$ is selected from a group consisting of O, S, and N(H);

$Z_3$ is $HPO_3$ or $SO_3$;

$R_a$ is selected from a group consisting of:

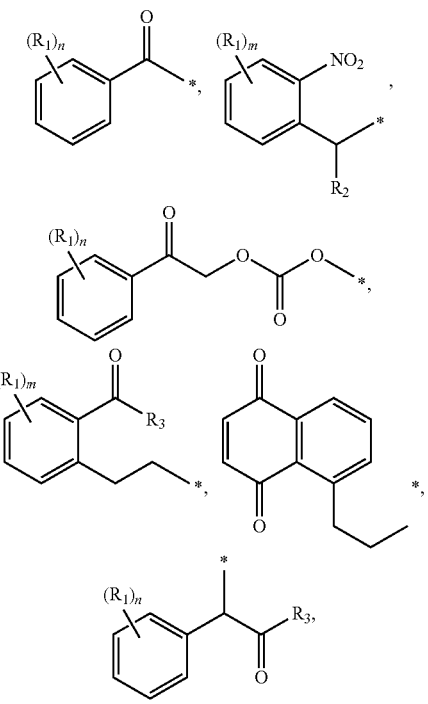

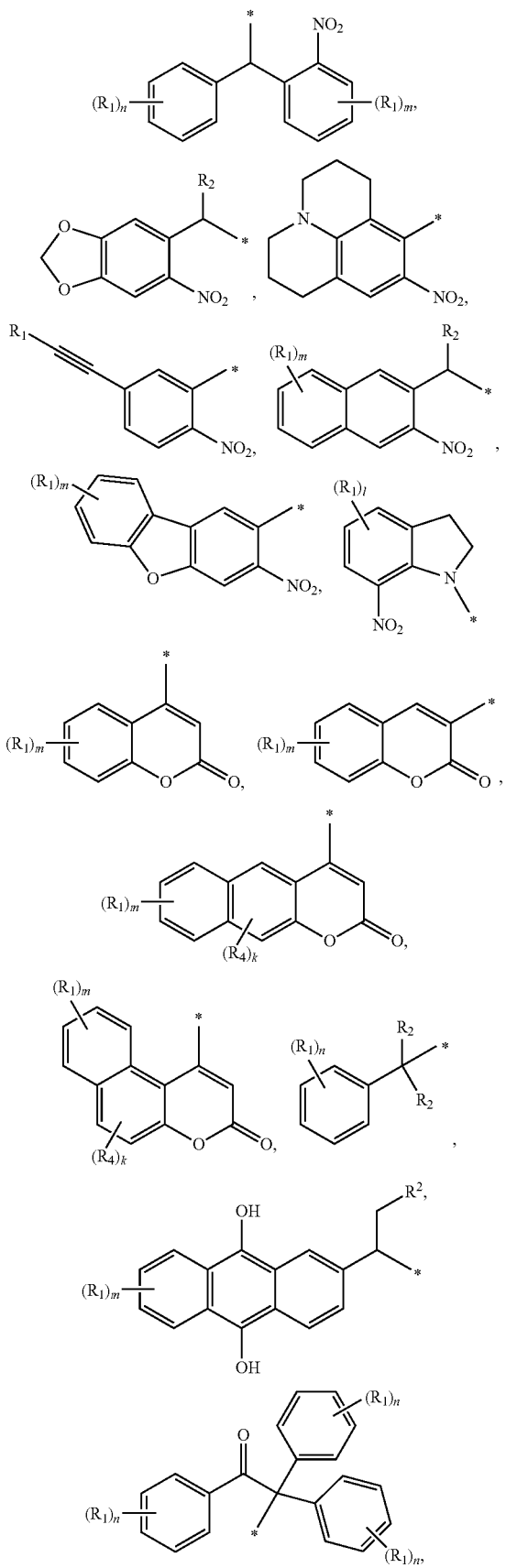
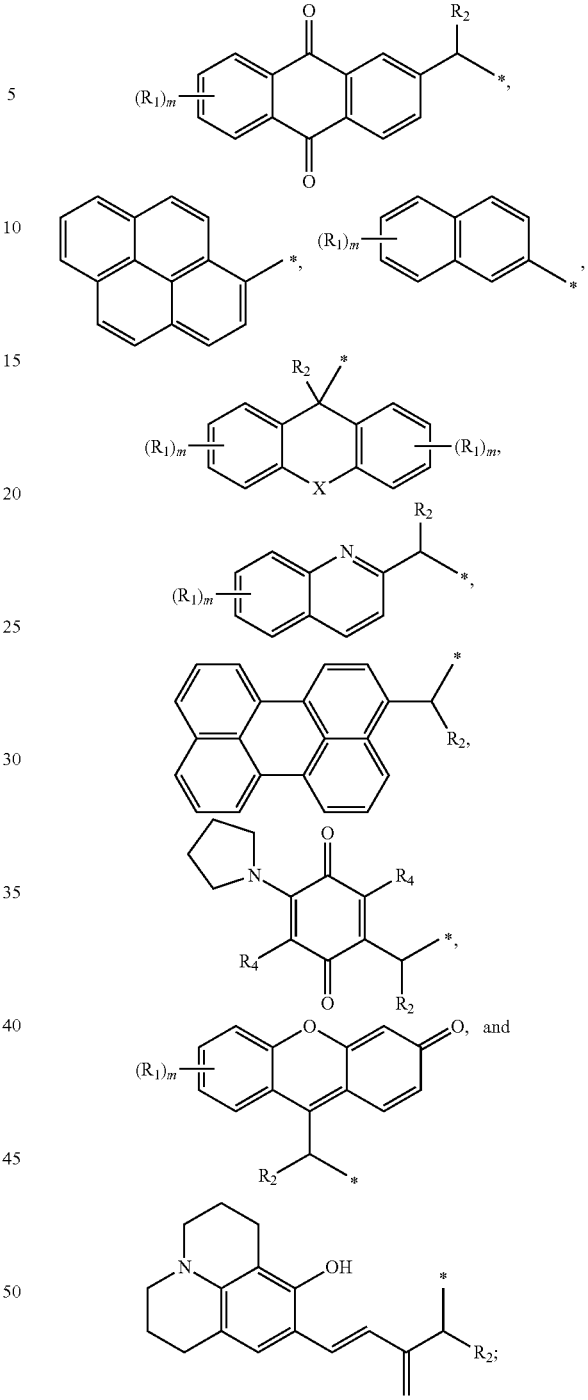

wherein * represents a bonding site;

each $R_1$ independently is selected from a group consisting of hydrogen, $C_{1-6}$ alkyl, $C_{1-6}$ haloalkyl, $C_{1-6}$ alkoxy, —OH, —SH, —COOH, halogen, substituted $C_{1-6}$ alkyl, substituted $C_{1-6}$ alkoxy, $C_{2-6}$ alkenyl, —CN, —NO$_2$, saturated or unsaturated 5 or 6-membered heterocyclic group containing at least one hetero atom, —N(R$_5$)$_2$, and aryl, wherein the heterocyclic group or the aryl is selectively substituted or unsubstituted with a functional group;

each $R_2$ independently is selected from a group consisting of hydrogen, $C_{1-6}$ alkyl, $C_{1-6}$ haloalkyl, $C_{1-6}$ alkoxy, —OH, —COOH, halogen, substituted $C_{1-6}$ alkyl, substituted $C_{1-6}$ alkoxy, $C_{2-6}$ alkenyl, —CN, —NO$_2$, and aryl, wherein the aryl is selectively substituted or unsubstituted with a functional group;

each $R_3$ independently is selected from a group consisting of $C_{1-6}$ alkyl, $C_{1-6}$ haloalkyl, and aryl, wherein the aryl is selectively substituted or unsubstituted with a functional group;

each $R_4$ independently is selected from a group consisting of $C_{1-6}$ alkyl, $C_{1-6}$ haloalkyl, halogen and —OH;

each $R_5$ independently is hydrogen or $C_{1-6}$ alkyl;

X is O or S;

n is an integer ranging from 0 to 5;

m is an integer ranging from 0 to 4;

l is an integer ranging from 0 to 3; and k is an integer ranging from 0 to 2;

$R_b$ is —Si(OR$_d$)$_3$, or

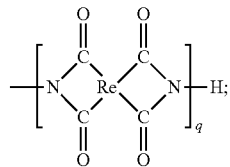

each $R_c$ independently is hydrogen or $C_{1-6}$ alkyl;

each $R_d$ independently is hydrogen or $C_{1-6}$ alkyl;

each $R_e$ independently is an aryl substituted or unsubstituted with a functional group;

p is an integer ranging from 1 to 5; and q is an integer ranging from 50 to 500.

Therefore, in the obtained electronic apparatus of the present invention, the material of the residue layer may comprises: at least one derivative of a material represented by the aforementioned formula (I) or (II) obtained after a radiation.

In the method for manufacturing the electronic apparatus of the present invention, when the substrate such as a flexible substrate is laminated on the carrier, the substrate is separated from the carrier with the debonding layer. After the material of the debonding layer is cleaved through a radiation, the substrate can be removed from the carrier. More specifically, in the method for manufacturing the electronic apparatus of the present invention, the debonding layer contains a light absorbing group ($R_a$), which is also referred to as a chromophore. When the light absorbing group is excited with a radiation having specific wavelength, a cleavage reaction is performed in the material of the debonding layer, so the substrate can be removed from the carrier. Hence, in the obtained electronic apparatus of the present invention, a side product obtained from the debonding layer after the cleavage reaction is remained on the substrate.

In addition, when the method of the present invention is used to manufacture an electronic apparatus, it is not necessary to pattern the debonding layer, so the problem that the debonding layer cannot well adhered on the substrate or the carrier can be prevented. Furthermore, compared to the method using laser with single wavelength, the wavelength of the radiation using in the method of the present invention can be selected according to the light absorbing group of the material used in the debonding layer. Hence, the machine for the radiation can be varied, and not limited to the expansive laser system. Therefore, the method of the present invention can be used to prepare an electronic apparatus with a flexible substrate in a simple and cheap way.

In the present invention, $R_a$ of the compound represented by the formula (I) or (II) is preferably selected from a group consisting of:

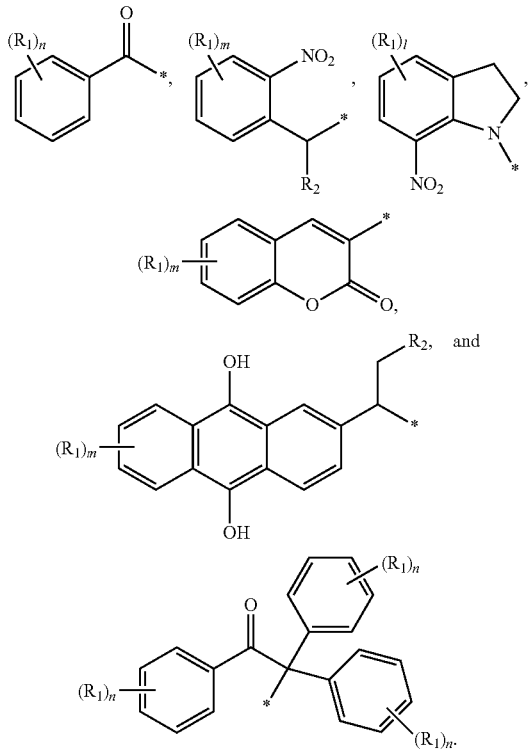

Hence, in the electronic apparatus obtained though the method of the aforementioned aspect of the present invention, the material of the residue layer preferably comprises: at least one compound selected from a group consisting of

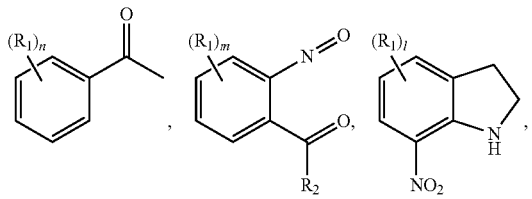

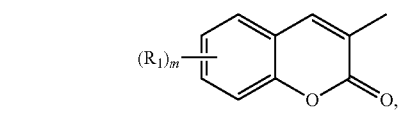

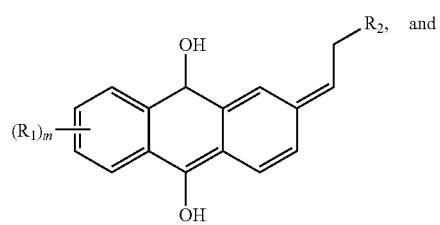

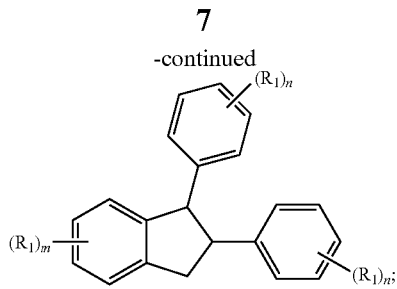

wherein each $R_1$ independently is selected from a group consisting of $C_{1-6}$ alkyl, $C_{1-6}$ haloalkyl, $C_{1-6}$ alkoxy, —OH, —SH, —COOH, halogen, substituted $C_{1-6}$ alkyl, substituted $C_{1-6}$ alkoxy, $C_{2-6}$ alkenyl, —CN, —NO$_2$, saturated or unsaturated 5 or 6-membered heterocyclic group containing at least one hetero atom, —N(R$_5$)$_2$, and aryl, wherein the heterocyclic group or the aryl is selectively substituted or unsubstituted with a functional group; each $R_2$ independently is selected from a group consisting of hydrogen, $C_{1-6}$ alkyl, $C_{1-6}$ haloalkyl, $C_{1-6}$ alkoxy, —OH, —COOH, halogen, substituted $C_{1-6}$ alkyl, substituted $C_{1-6}$ alkoxy, $C_{2-6}$ alkenyl, —CN, —NO$_2$, and aryl, wherein the aryl is selectively unsubstituted or substituted with a functional group; each $R_5$ independently is hydrogen or $C_{1-6}$ alkyl; n is an integer ranging from 0 to 5; m is an integer ranging from 0 to 4; and l is an integer ranging from 0 to 3.

Preferably, each $R_1$ independently is selected from a group consisting of $C_{1-6}$ alkyl, $C_{1-6}$ alkoxy, —OH, —SH, —COOH, halogen, —NO$_2$, and —N(R$_5$)$_2$; each $R_2$ independently is selected from a group consisting of hydrogen, $C_{1-6}$ alkyl, $C_{1-6}$ haloalkyl, $C_{1-6}$ alkoxy, halogen, and —NO$_2$; each $R_5$ independently is hydrogen or $C_{1-6}$ alkyl; n is an integer ranging from 0 to 2; l is an integer ranging from 0 to 2; and m is an integer ranging from 0 to 2.

More preferably, each $R_1$ independently is selected from a group consisting of $C_{1-4}$ alkyl, $C_{1-4}$ alkoxy, —OH, —SH, —COOH, halogen, —NO$_2$, and —N(R$_5$)$_2$; each $R_2$ independently is selected from a group consisting of hydrogen, $C_{1-4}$ alkyl, $C_{1-4}$ fluoroalkyl, $C_{1-4}$ alkoxy, halogen, and —NO$_2$; each $R_5$ independently is hydrogen or $C_{1-4}$ alkyl; n is an integer ranging from 0 to 2; l is an integer ranging from 0 to 2; and m is an integer ranging from 0 to 2.

In the present invention, examples of the $R_a$ of the compound represented by the formula (I) or (II) comprises, but not limited to: (wherein * represents the bonding site)

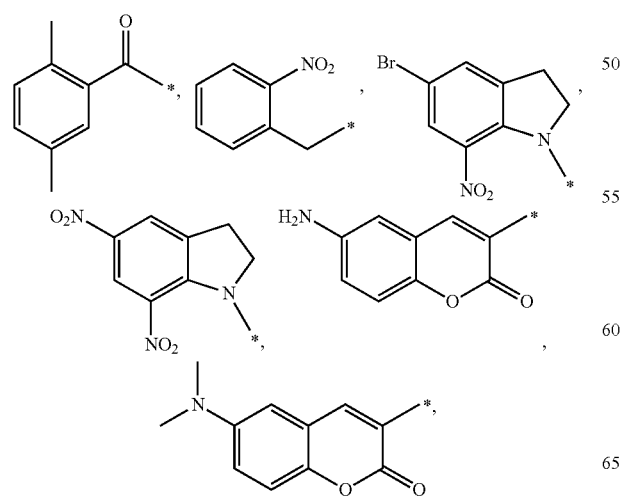

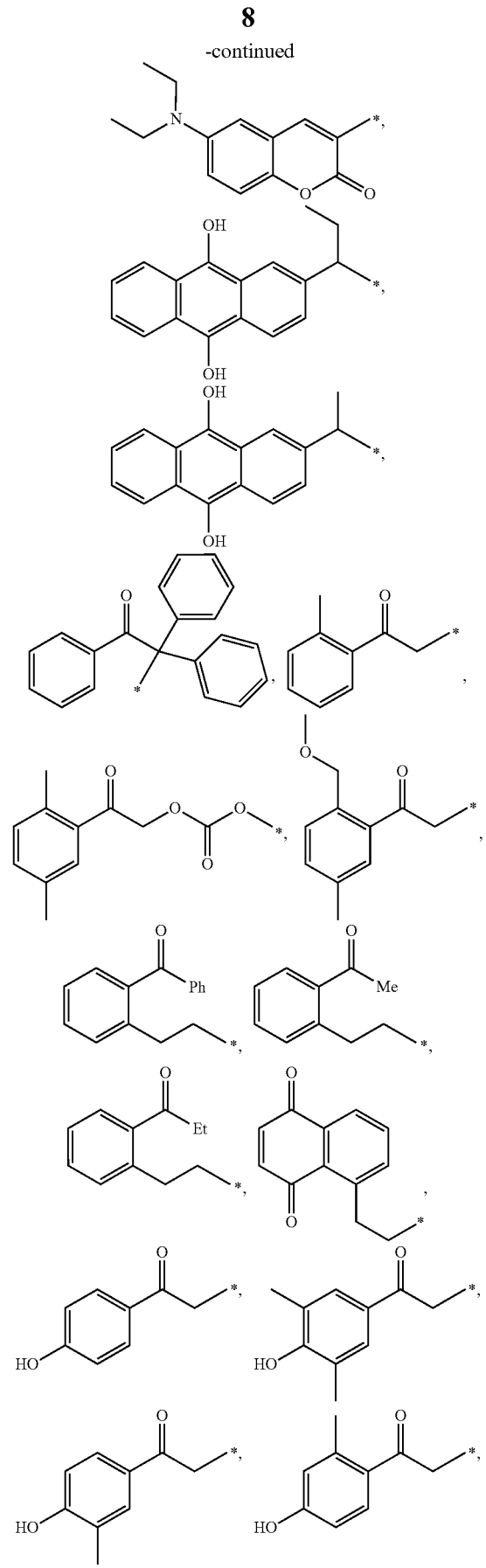

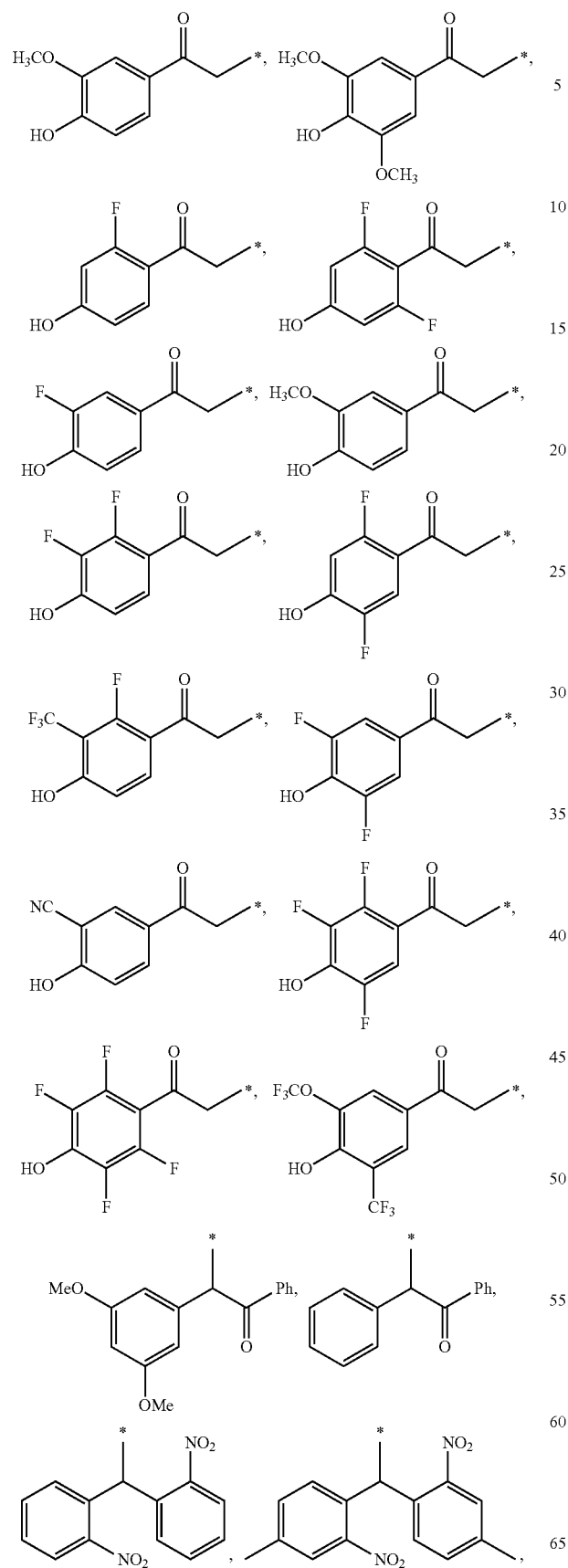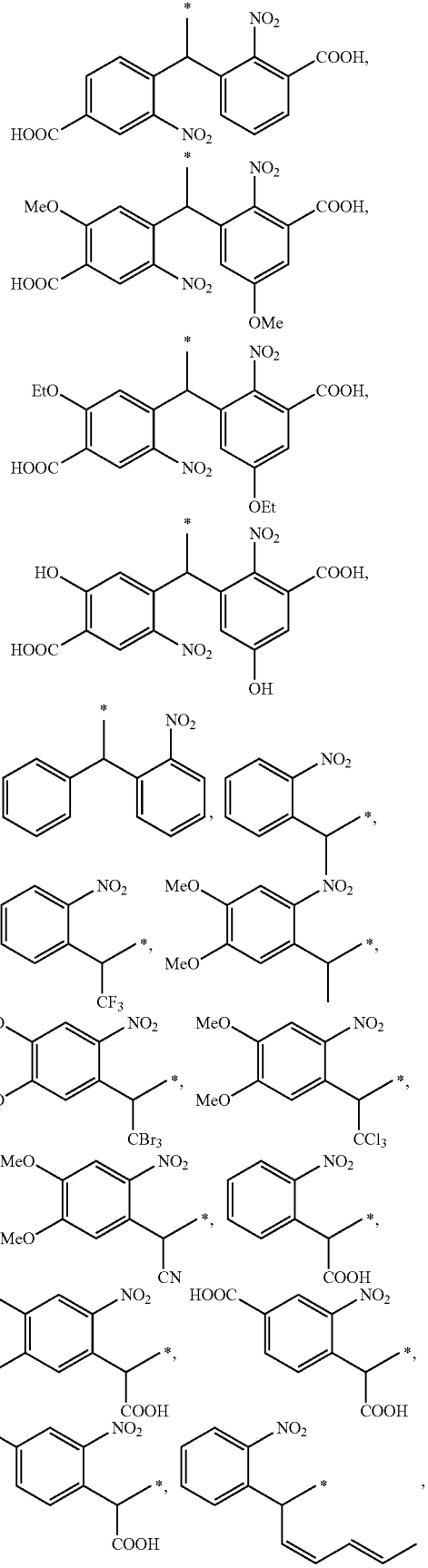

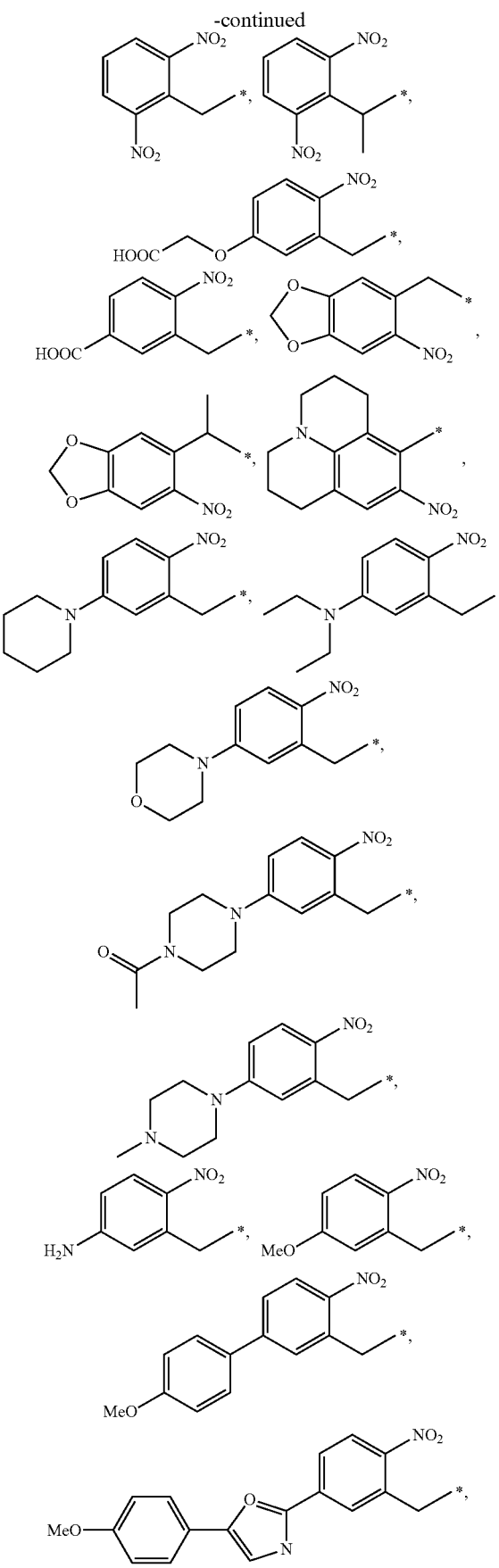
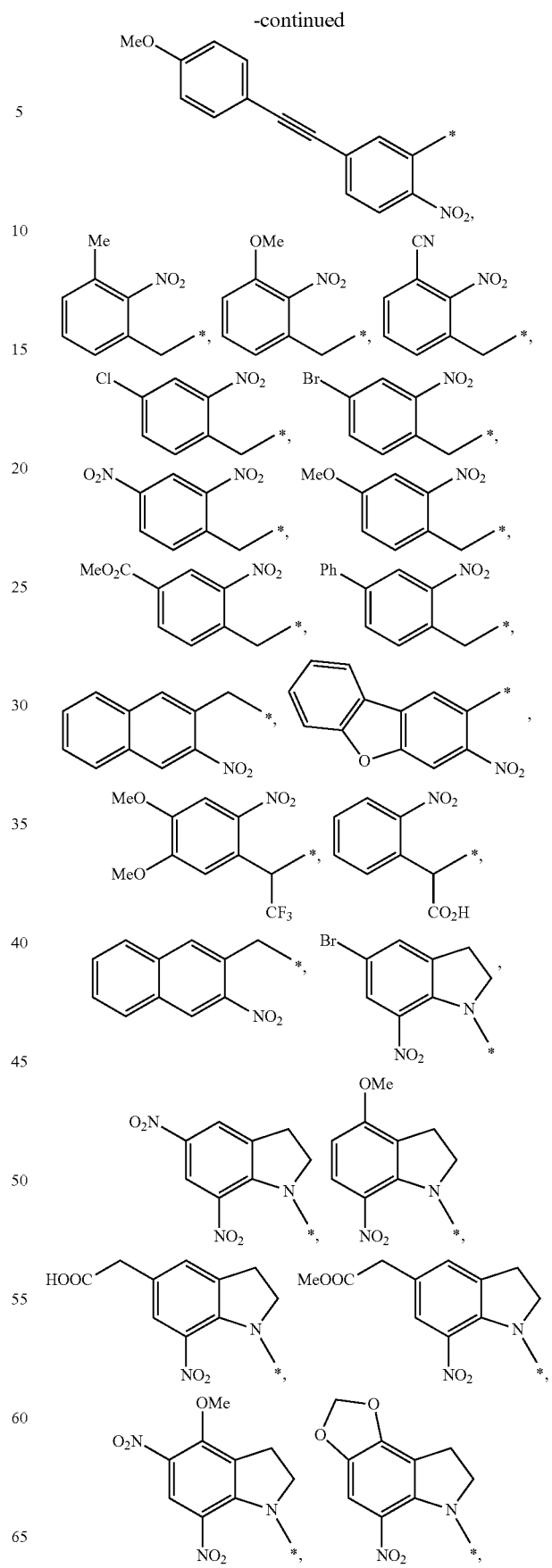

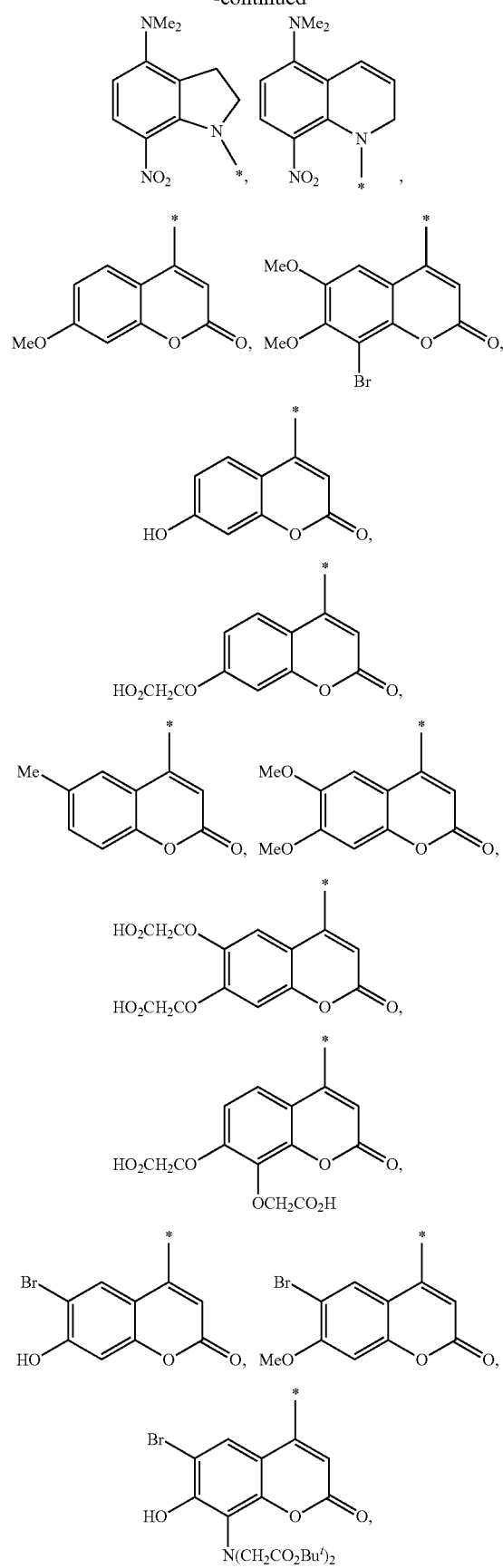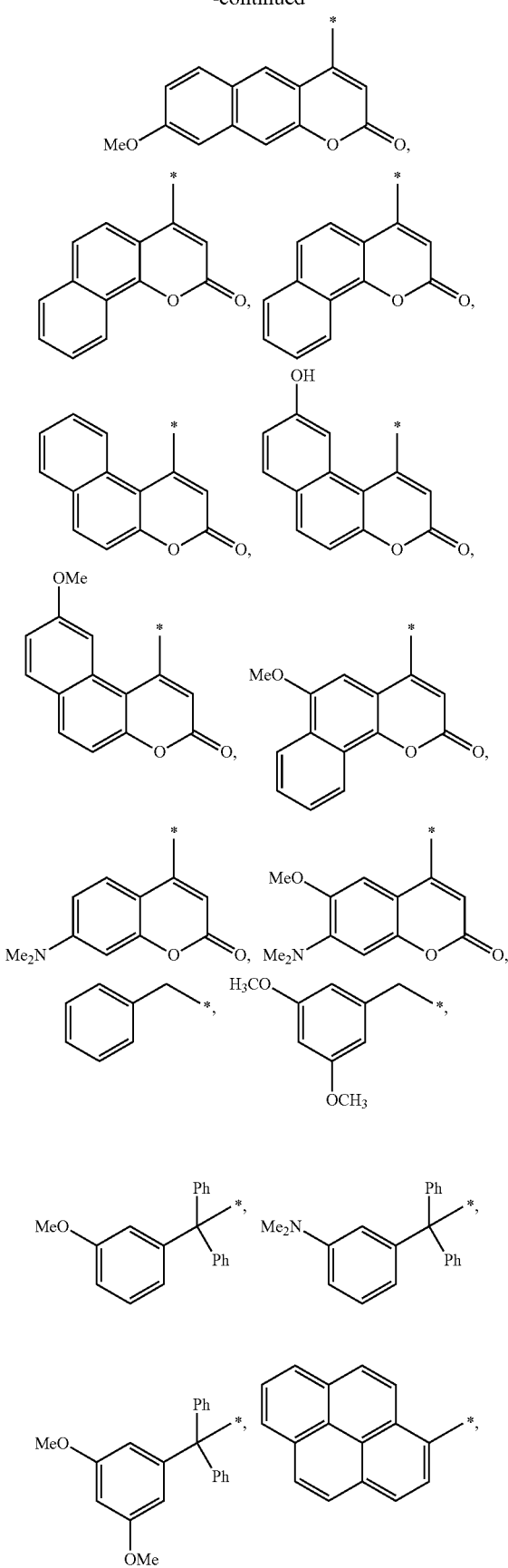

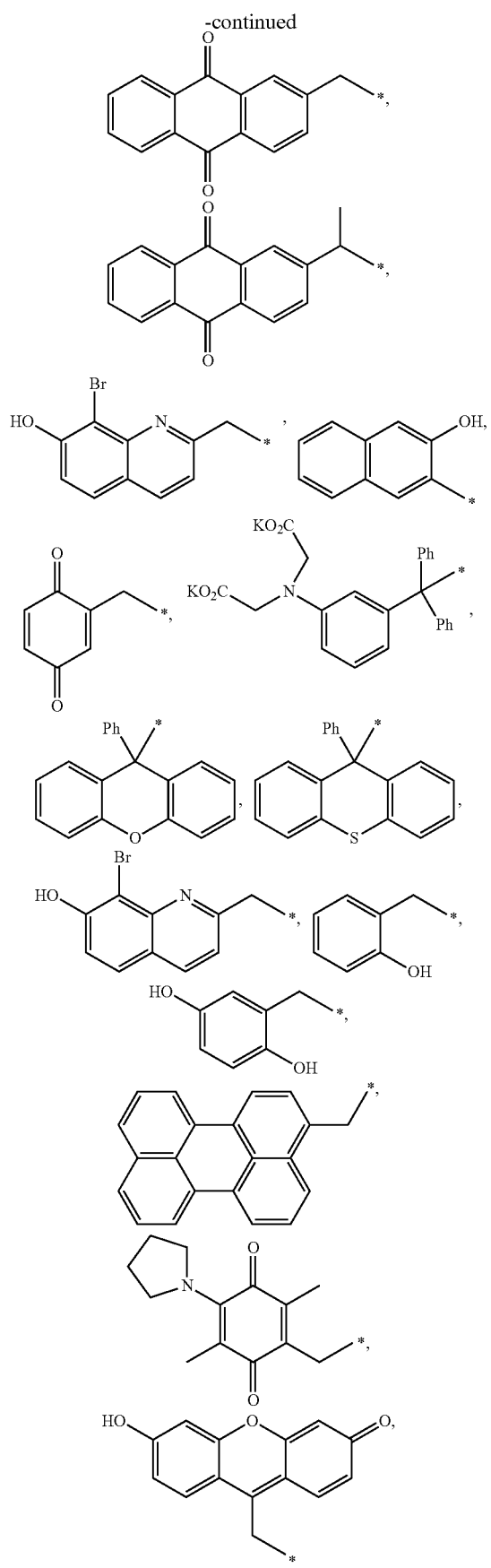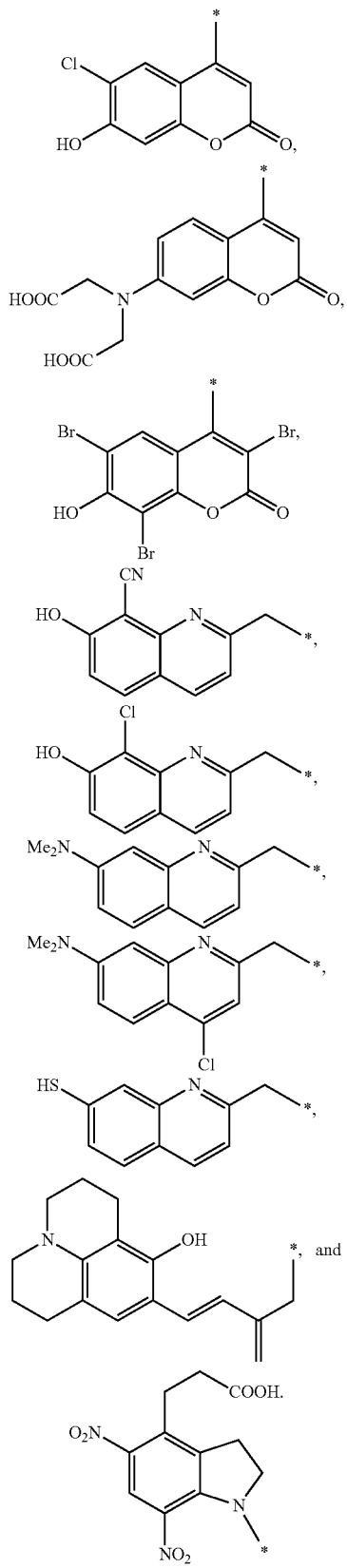
In one aspect of the present invention, the $R_a$ of the compound represented by the formula (I) or (II) is:

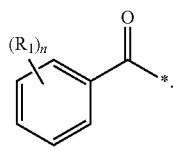

Therefore, in the electronic apparatus obtained by the method of the present aspect, the material of the residue layer is:

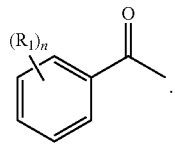

Herein, each $R_1$ independently is selected from a group consisting of $C_{1-6}$ alkyl, $C_{1-6}$ alkoxy, —OH, —SH, —COOH, halogen, —NO$_2$, and —N(R$_5$)$_2$; each $R_5$ independently is hydrogen or $C_{1-6}$ alkyl; and n is an integer ranging from 0 to 2. Preferably, each $R_1$ independently is selected from a group consisting of $C_{1-4}$ alkyl, $C_{1-4}$ alkoxy, —OH, —COOH, —F, —Cl, —NO$_2$, and —NH$_2$; and n is an integer ranging from 0 to 2. More preferably, each $R_1$ independently is selected from a group consisting of methyl, ethyl, propyl, methoxy, ethyoxy, propoxy, —OH, —COOH, —F, —Cl, —NO$_2$, and —NH$_2$; and n is 0 or 2. Most preferably, the $R_a$ of the compound represented by the formula (I) or (II), and the material of the residue layer obtained from the same respectively are:

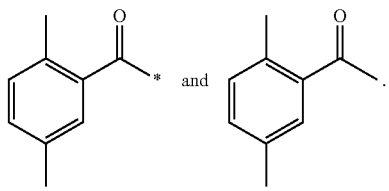

In another aspect of the present invention, the $R_a$ of the compound represented by the formula (I) or (II) is:

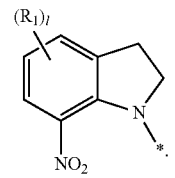

Therefore, in the electronic apparatus obtained by the method of the present aspect, the material of the residue layer is:

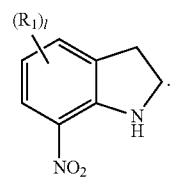

Herein, each $R_1$ independently is selected from a group consisting of $C_{1-6}$ alkyl, $C_{1-6}$ alkoxy, —OH, —SH, —COOH, halogen, —NO$_2$, and —N(R$_5$)$_2$; each $R_5$ independently is hydrogen or $C_{1-6}$ alkyl; and l is an integer ranging from 0 to 3. Preferably, each $R_1$ independently is selected from a group consisting of $C_{1-4}$ alkyl, $C_{1-4}$ alkoxy, —OH, —SH, —COOH, —Cl, —Br, —NO$_2$, and —NH$_2$; and l is an integer ranging from 0 to 2. More preferably, each $R_1$ independently is selected from a group consisting of methyl, ethyl, propyl, methoxy, ethyoxy, propoxy, —OH, —COOH, —Cl, —Br, —NO$_2$, and —NH$_2$; and l is an integer ranging from 0 to 2. Most preferably, the $R_a$ of the compound represented by the formula (I) or (II), and the material of the residue layer obtained from the same respectively are:

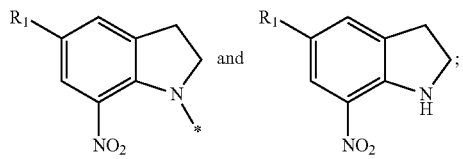

wherein, $R_1$ is —Br or —NO$_2$.

In further another aspect of the present invention, the $R_a$ of the compound represented by the formula (I) or (II) is:

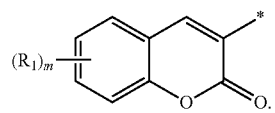

Therefore, in the electronic apparatus obtained by the method of the present aspect, the material of the residue layer is:

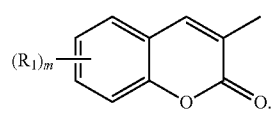

Herein, each $R_1$ independently is selected from a group consisting of $C_{1-6}$ alkyl, $C_{1-6}$ alkoxy, —OH, —SH, —COOH, halogen, —NO$_2$, and —N(R$_5$)$_2$; each $R_5$ independently is hydrogen or $C_{1-6}$ alkyl; and m is an integer ranging from 0 to 4. Preferably, each $R_1$ independently is selected from a group consisting of $C_{1-4}$ alkyl, $C_{1-4}$ alkoxy, —OH, —COOH, —F, —Cl, —NO$_2$, and —N(R$_5$)$_2$; each $R_5$ independently is hydrogen or $C_{1-4}$ alkyl; and m is an integer ranging from 0 to 2. More preferably, each $R_1$ independently is selected from a group consisting of methyl, ethyl, propyl, methoxy, ethyoxy, propoxy, —OH, —COOH, —Cl, and —N(R$_5$)$_2$; each $R_5$ independently is hydrogen, methyl, ethyl, or propyl; and m is an integer ranging from 0 to 2. Most preferably, the $R_a$ of the compound represented by the formula (I) or (II), and the material of the residue layer obtained from the same respectively are:

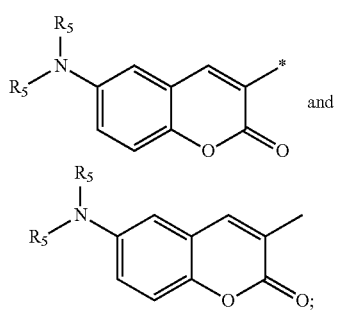

and

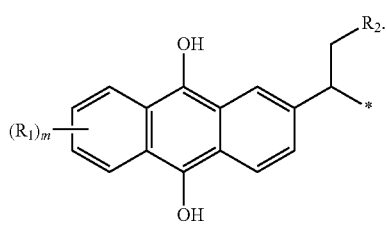

wherein, both R₅ are hydrogen, methyl or ethyl in one molecule.

In further another aspect of the present invention, the $R_a$ of the compound represented by the formula (I) or (II) is:

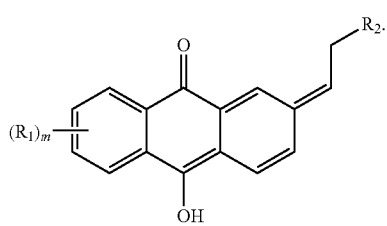

Therefore, in the electronic apparatus obtained by the method of the present aspect, the material of the residue layer is:

Herein, each $R_1$ independently is selected from a group consisting of $C_{1-6}$ alkyl, $C_{1-6}$ alkoxy, —OH, —SH, —COOH, halogen, —NO$_2$, and —N(R$_5$)$_2$; each $R_2$ independently is selected from a group consisting of hydrogen, $C_{1-6}$ alkyl, $C_{1-6}$ haloalkyl, $C_{1-6}$ alkoxy, —OH, —COOH, halogen, —CN, and —NO$_2$; each $R_5$ independently is hydrogen or $C_{1-6}$ alkyl; and m is an integer ranging from 0 to 4. Preferably, each $R_1$ independently is selected from a group consisting of $C_{1-4}$ alkyl, $C_{1-4}$ alkoxy, —OH, —SH, —COOH, —Cl, —Br, —NO$_2$, and —N(R$_5$)$_2$; each $R_2$ independently is selected from a group consisting of hydrogen, $C_{1-4}$ alkyl, $C_{1-4}$ haloalkyl, $C_{1-4}$ alkoxy, —COOH, —Cl, —Br, —CN, and —NO$_2$; each $R_5$ independently is hydrogen or $C_{1-4}$ alkyl; and m is an integer ranging from 0 to 2. More preferably, each $R_1$ independently is selected from a group consisting of methyl, ethyl, propyl, methoxy, ethyoxy, propoxy, —OH, —COOH, —Cl, —Br, —NO$_2$, and —N(R$_5$)$_2$; each $R_2$ independently is selected from a group consisting of hydrogen, methyl, ethyl, propyl, methoxy, ethyoxy, propoxy, and —NO$_2$; each $R_5$ independently is hydrogen, methyl, ethyl, or propyl; and m is an integer ranging from 0 to 2. Most preferably, the $R_a$ of the compound represented by the formula (I) or (II), and the material of the residue layer obtained from the same respectively are:

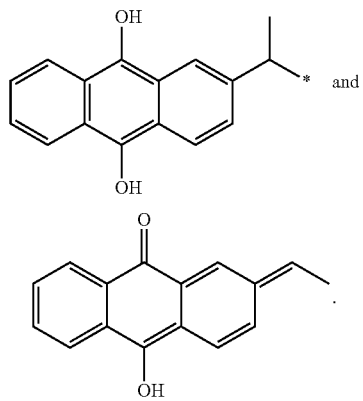

In further another aspect of the present invention, the $R_a$ of the compound represented by the formula (I) or (II) is:

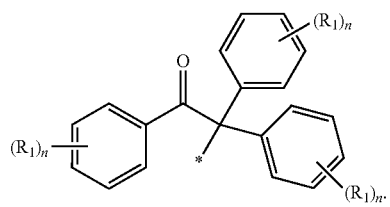

Therefore, in the electronic apparatus obtained by the method of the present aspect, the material of the residue layer is:

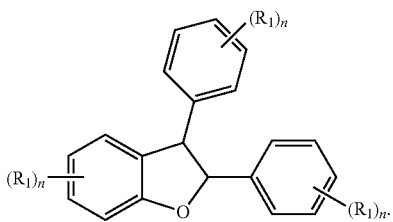

Herein, each $R_1$ independently is selected from a group consisting of $C_{1-6}$ alkyl, $C_{1-6}$ alkoxy, —OH, —SH, —COOH, halogen, —NO$_2$, and —N(R$_5$)$_2$; each $R_5$ independently is hydrogen or $C_{1-6}$ alkyl; n is an integer ranging from 0 to 5; and m is an integer ranging from 0 to 4. Preferably, each $R_1$ independently is selected from a group consisting of $C_{1-4}$ alkyl, $C_{1-4}$ alkoxy, —OH, —COOH, —F, —NO$_2$, and —NH$_2$; n and m are independently an integer ranging from 0 to 2. More preferably, each $R_1$ independently is selected from a group consisting of methyl, ethyl, propyl, methoxy, ethyoxy, propoxy, —OH, —COOH, —F, —NO$_2$, and —NH$_2$; n and m are independently 0 or 2. Most preferably, the $R_a$ of the compound represented by the formula (I) or (II), and the material of the residue layer obtained from the same respectively are:

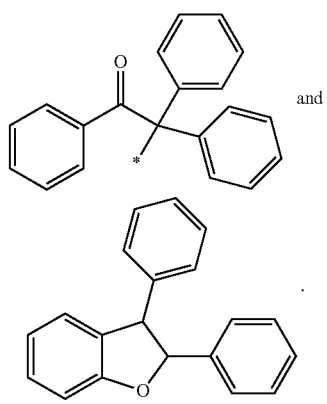

and

In further another aspect of the present invention, the $R_a$ of the compound represented by the formula (I) or (II) is:

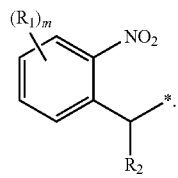

Therefore, in the electronic apparatus obtained by the method of the present aspect, the material of the residue layer is:

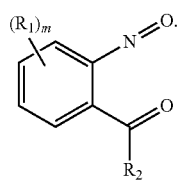

Herein, each $R_1$ independently is selected from a group consisting of $C_{1-6}$ alkyl, $C_{1-6}$ haloalkyl, $C_{1-6}$ alkoxy, $C_{2-6}$ alkenyl, —OH, —SH, —COOH, halogen, —NO$_2$, and —N(R$_5$)$_2$; each $R_2$ independently is selected from a group consisting of hydrogen, $C_{1-6}$ alkyl, $C_{1-6}$ haloalkyl, $C_{1-6}$ alkoxy, —OH, —COOH, halogen, —CN, and —NO$_2$; each $R_5$ independently is hydrogen or $C_{1-6}$ alkyl; and m is an integer ranging from 0 to 4. Preferably, each $R_1$ independently is selected from a group consisting of $C_{1-4}$ alkyl, $C_{1-4}$ haloalkyl, $C_{1-4}$ alkoxy, —OH, —SH, —COOH, halogen, —NO$_2$, and —N(R$_5$)$_2$; each $R_2$ independently is selected from a group consisting of hydrogen, $C_{1-6}$ alkyl, $C_{1-6}$ haloalkyl, $C_{1-6}$ alkoxy, —OH, —COOH, halogen, —CN, and —NO$_2$; each $R_5$ independently is hydrogen or $C_{1-4}$ alkyl; and m is an integer ranging from 0 to 4. More preferably, each $R_1$ independently is selected from a group consisting of methyl, ethyl, propyl, methoxy, ethyoxy, propoxy, —CH$_2$F, —CHF$_2$, —CF$_3$, —CH$_2$Br, —CHBr$_2$, —CBr$_3$, —OH, —COOH, —F, —Cl, —Br, —NO$_2$, and —N(R$_5$)$_2$; each $R_2$ independently is selected from a group consisting of hydrogen, methyl, ethyl, propyl, methoxy, ethyoxy, propoxy, —CH$_2$F, —CHF$_2$, —CF$_3$, —CH$_2$Br, —CHBr$_2$, —CBr$_3$, —OH, —F, —Cl, —Br, and —NO$_2$; each $R_5$ independently is hydrogen, methyl, ethyl, or propyl; and m is an integer ranging from 0 to 2. Most preferably, the $R_a$ of the compound represented by the formula (I) or (II), and the material of the residue layer obtained from the same respectively are:

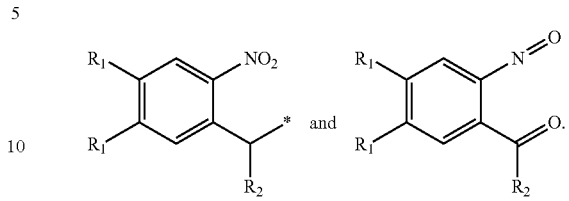

Herein, each $R_1$ independently is selected from a group consisting of methyl, ethyl, propyl, methoxy, ethyoxy, propoxy, —CH$_2$F, —CHF$_2$, —CF$_3$, —OH, —COOH, —F, —Cl, —Br, —NO$_2$, and —N(R$_5$)$_2$; each $R_2$ independently is selected from a group consisting of hydrogen, methyl, ethyl, propyl, methoxy, ethyoxy, propoxy, —CH$_2$F, —CHF$_2$, —CF$_3$, —OH, —F, —Cl, —Br, and —NO$_2$; and each $R_5$ independently is hydrogen, methyl, ethyl, or propyl.

In the present invention, $Z_1$ of the compound represented by the formula (I) or (II) is selected from a group consisting of O, S, N, C(R$_c$)$_2$, and a bond; $Z_2$ is selected from a group consisting of O, S, and N; $Z_3$ is —HPO$_3$— (—O—P(=O)(—OH)—) or —SO$_3$— (—O—S(=O)$_2$—); and p is an integer ranging from 1 to 5. Herein, each $R_c$ independently is hydrogen or $C_{1-6}$ alkyl. Preferably, each $R_c$ independently is hydrogen or $C_{1-4}$ alkyl. More preferably, each $R_c$ independently is hydrogen, methyl, ethyl or propyl.

In addition, in the present invention, $R_b$ of the compound represented by the formula (I) or (II) is —Si(OR$_d$)$_3$ or a polyimide chain represented by the following formula (III):

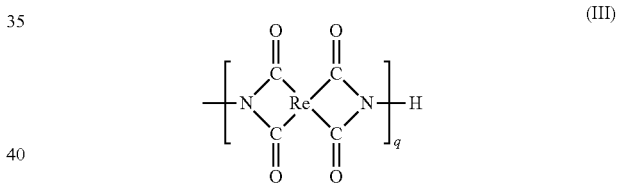

Herein, each $R_d$ independently is hydrogen or $C_{1-6}$ alkyl. Preferably, each $R_d$ independently is hydrogen or $C_{1-4}$ alkyl. More preferably, each $R_d$ independently is hydrogen, methyl, ethyl, or propyl. Most preferably, all $R_d$ in molecule are hydrogen, methyl, ethyl, or propyl at the same time. In addition, each $R_e$ independently is an aryl substituted or unsubstituted with a functional group. Preferably, each $R_e$ independently is an unsubstituted aryl group. Furthermore, q is an integer ranging from 50 to 500. Preferably, q is an integer ranging from 50 to 100.

In the most preferred embodiment of the present invention, the material of the debonding layer is the compound represented by the formula (I), wherein $Z_1$ is O, $Z_2$ is —N(H)—; $R_b$ is —Si(OR$_d$)$_3$; each $R_d$ independently is hydrogen or $C_{1-6}$ alkyl; p is an integer ranging from 1 to 5; and $R_a$ is:

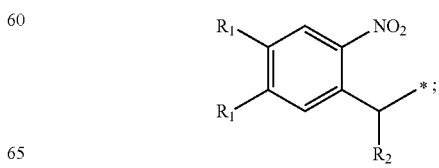

wherein each $R_1$ independently is selected from a group consisting of methyl, ethyl, propyl, methoxy, ethyoxy, propoxy, —$CH_2F$, —$CHF_2$, —$CF_3$, —OH, —COOH, —F, —Cl, —Br, —$NO_2$, and —$N(R_5)_2$; each $R_2$ independently is selected from a group consisting of hydrogen, methyl, ethyl, propyl, methoxy, ethyoxy, propoxy, —$CH_2F$, —$CHF_2$, —$CF_3$, —OH, —F, —Cl, —Br, and —$NO_2$; and each $R_5$ independently is hydrogen, methyl, ethyl, or propyl. Preferably, all $R_d$ in one molecule are methyl, ethyl, propyl, or butyl; p is an integer ranging from 1 to 2; all $R_1$ in one molecule are methyl, ethyl, propyl, methoxy, ethyoxy, propoxy, —$CH_2F$, —$CHF_2$, —$CF_3$, —OH, —COOH, —F, —Cl, —Br, —$NO_2$, and —$N(R_5)_2$; each $R_2$ independently is selected from a group consisting of hydrogen, methyl, ethyl, and propyl; and each $R_5$ independently is hydrogen, methyl, or ethyl. Thus, in the most preferred embodiment of the present invention, the material of the residue layer in the obtained electronic apparatus is:

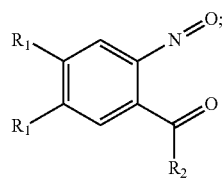

wherein each $R_1$ and $R_2$ are the same as the aforementioned definition.

In the present invention, the term "unsubstituted or substituted" indicates that alkyl, haloalkyl, alkoxy, alkenyl, heterocyclic group, or aryl is unsubstituted or substituted with a functional group. Herein, this functional group preferably is a group capable of providing hydrophobicity, for example, epoxy, halogen such as F and Cl, thiol, —SH, and acyloxy. In addition, the term "aryl" used in the present invention includes aromatic rings containing 5, 6, 7, 8, 9 or more carbon atoms, and the examples thereof comprises but are not limited to: phenyl or naphthyl. Preferably, the aryl is phenyl. Furthermore, the term "alkyl" used in the present invention includes linear and branch alkyl groups, and the examples thereof comprises but are not limited to: methyl, ethyl, n-propyl, isopropyl, n-butyl, iso-butyl, sec-butyl, tert-butyl, n-pentyl, iso-pentyl, and hexyl. The term "halogen" used in the present invention includes F, Cl, Br and I. Preferably, the halogen used herein is F, Cl or Br. More preferably, the halogen used herein is Cl or Br. The term "heterocyclic group" used in the present invention indicates a heteroaryl group and a hetero-cycloalkyl group containing at least one hetero atom, each hetero atom is selected from O, S and N, the ring of the heterocyclic group comprise 5 or 6 atoms, and any ring thereof does not contain two adjacent O or S. The term "alkoxy" used in the present invention indicates a group that an O atom is added onto the aforementioned alkyl, and the examples thereof comprise but are not limited to: methoxy, ethyoxy, propoxy, 2-propoxy, butoxy, iso-butoxy, pentyloxy, and hexyloxy. The term "haloalkyl" comprises alkyl, alkenyl, alkynyl, and alkoxy in which at least one hydrogen atom is substituted with a halogen atom; and when two or more hydrogen atoms are substituted with halogen atoms, these halogen atoms can be identical to or different from each other.

In the method of the present invention, the material of the carrier is not particularly limited, as long as the carrier can be applied on the current used machine in the art, for example, a glass carrier, a quartz carrier, or a plastic carrier. Preferably, the carrier has a light transmittance larger than 30%. More preferably, the light transmittance of the carrier is in a range from 80% to 99%. Most preferably, the light transmittance thereof is in a range from 90% to 99%. Specifically, the carrier preferably has a light transmittance larger than 30% under UV light radiation (which has a wavelength of 200-420 nm). More preferably the light transmittance of the carrier is in a range from 80% to 99% under UV light radiation. Most preferably, the light transmittance thereof is in a range from 90% to 99% under UV light radiation.

In addition, in the step (A) of the method of the present invention, the material of the debonding layer can be formed on the surface of the carrier through any known manner generally used in the art, such as dip coating, roll coating, print coating, spin coating, or deposition. Herein, the material of the debonding layer is preferably adhered on the carrier through covalent bonds. In addition, when the coating process is performed to form the debonding layer, the concentration of the material in the mixture for forming the debonding layer is in a range from 0.01 wt % to 10 wt %. However, the concentration thereof is not limited to the aforementioned range, and can be adjusted according to the viscosity thereof and the used solvent in the mixture as long as the debonding layer can be formed uniformly on the substrate.

In addition, when the carrier is a plastic carrier, the material of the debonding layer can be formed not only through the aforementioned manner, but also through chemical modification by directly bonding $R_b$ of the compound represented by the formula (I) or (II) onto the plastic substrate. In this case, the plastic carrier and the debonding layer together can be served as a plastic board. Furthermore, the thickness of the debonding layer is not particularly limited, as long as it can achieve the purpose of the present invention. For example, the thickness thereof can be in a range from 100 Å to 2000 Å, but the present invention is not limited thereto.

In the step (B) of the method of the present invention, the substrate can be disposed on the carrier with the debonding layer formed thereon through any disposition manner generally used in the art, such as lamination and adhering process. Alternatively, the substrate can be formed on the carrier through coating a material for forming the substrate onto the carrier with the debonding layer formed thereon through the aforementioned coating manners, and then the substrate of the present invention can be obtained after a curing process. In any one of the lamination process, adhering process and the coating process for disposing the substrate, the debonding layer is located between the substrate and the carrier, and the second surface of the substrate contacts the debonding layer.

In the electronic apparatus and the method for manufacturing the same of the present invention, the used substrate can be any flexible substrate generally used in the art. Particularly, the flexible substrate has a feature that a bending displacement thereof is more than 80 mm. Herein, the "bending displacement" is defined by the following equation (I):

$$\omega = \frac{5}{32} \frac{l^4 g \rho (1 - v^2)}{E t^2}, \quad (I)$$

wherein ω is deformation amount, ρ is the gravity of the material, l is the length thereof, ν is Poisson's ratio, t is the thickness thereof, E is Young's modulus, and g is acceleration of gravity.

The examples of the flexible substrate capable of using in the present invention include: a thin glass substrate, a polymer substrate, a polymer-metal composite substrate, or a polymer-metal oxide composite substrate, in which the polymer can be PI, PA, PMMA, or a combination thereof, and the thin glass substrate is a glass substrate with a thickness of 0.1-0.3 mm.

In the electronic apparatus and the method for manufacturing the same of the present invention, the electronic unit layer can be any unit known in the art, such as a display unit, a thin film transistor unit, and a touch unit, and one or a plurality of the aforementioned units can be laminated on the first surface of the substrate. Herein, the display unit is a liquid crystal display unit or an organic light emitting diode display unit.

In the electronic apparatus and the method for manufacturing the same of the present invention, a radiation is performed on the debonding layer to photo-react (alternatively, photo-cleave) the material thereof, and thus the substrate can be separated from the carrier. In the present invention, when the light absorbing group ($R_a$) of the material of the debonding layer is excited by an UV light source having wavelength ranging from 200 nm to 420 nm, the side product generated after the cleavage of the material thereof is remained on the second surface of the substrate to form a residue layer, wherein the residue layer may be adhered on the second surface of the substrate through a van der Waals' force, a hydrogen bond, or a π-π interaction.

In addition, in the method of the present invention, the radiation is provided from the side of the carrier, i.e. from the backside of the carrier. More specifically, in the method of the present invention, the radiation is provided onto the carrier without the debonding layer formed thereon, so that the light can be penetrated through the carrier to achieve the debonding layer to perform the photo-reaction (or, the photo-cleavage). Herein, the wavelength, the light intensity, and the radiation time are not particularly limited, and can be selected according to the material of the debonding layer, as long as the separation between the substrate and the carrier can be achieved. For example, the wavelength of the UV light can be in a range from 200 nm to 420 nm; or the accumulated amount of the light can be in a range from 1 J to 60 J.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Hereinafter, the electronic apparatus and the method for manufacturing the same of one preferred embodiment of the present invention are illustrated in detail according to FIG. 1A to FIG. 1E.

Figure 1A:
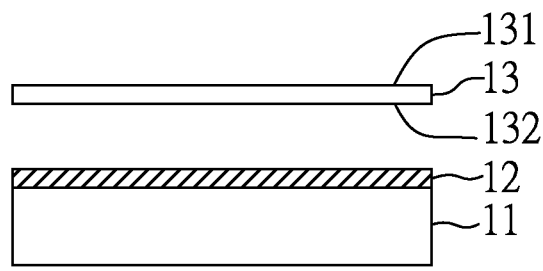
FIG. 1A to FIG. 1E are cross-sectional views showing a process for manufacturing an electronic apparatus according to one preferred embodiment of the present invention.

First, as shown in FIG. 1A, a carrier 11 is provided, which can be a glass carrier, a quartz carrier, or a plastic carrier known in the art, and has a light transmittance larger than 30%. In the present embodiment, a glass substrate or a plastic substrate having high light transmittance is used.

Then, a debonding layer 12 is formed on the carrier 11 through dip coating, roll coating, print coating, spin coating, or deposition, wherein the material of the debonding layer 12 comprises: a siloxane compound or a polyimide compound containing at least one selected from a group consisting of aryl, nitro and ketone. The specific examples of the material of the debonding layer 12 comprise: at least one compound represented by the following formula (I) or (II):

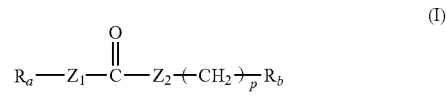

(I)

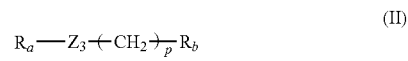

(II)

wherein $Z_1$ is selected from a group consisting of O, S, N, $C(R_c)_2$, and a bond;

$Z_2$ is selected from a group consisting of O, S, and N;

$Z_3$ is $HPO_3$ or $SO_3$;

$R_a$ is selected from a group consisting of:

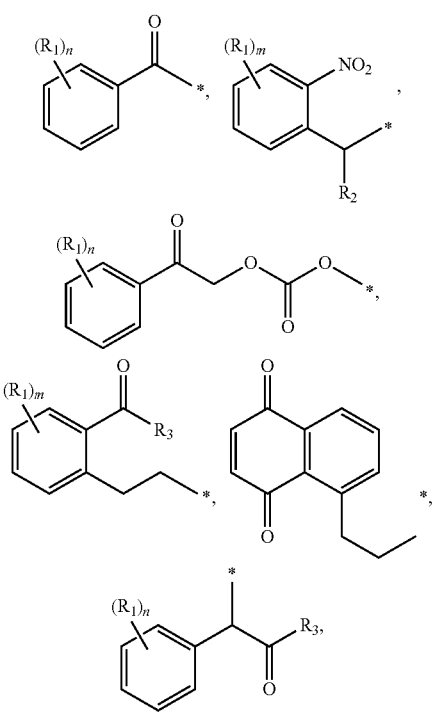

-continued

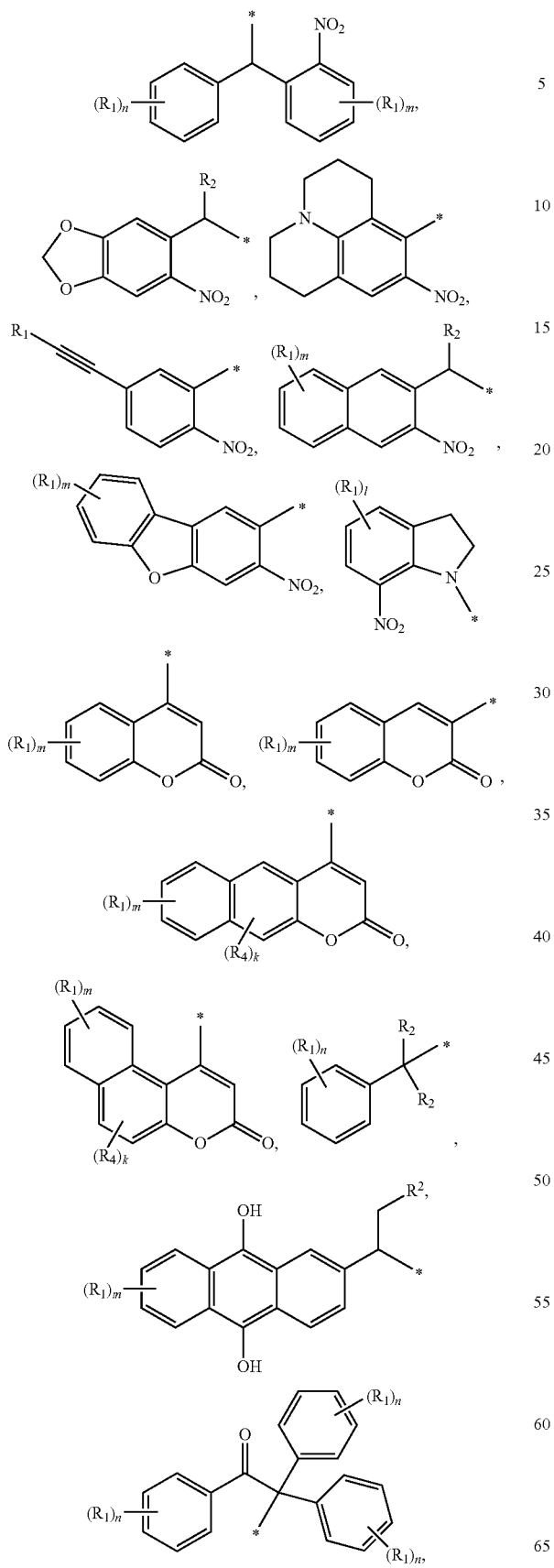

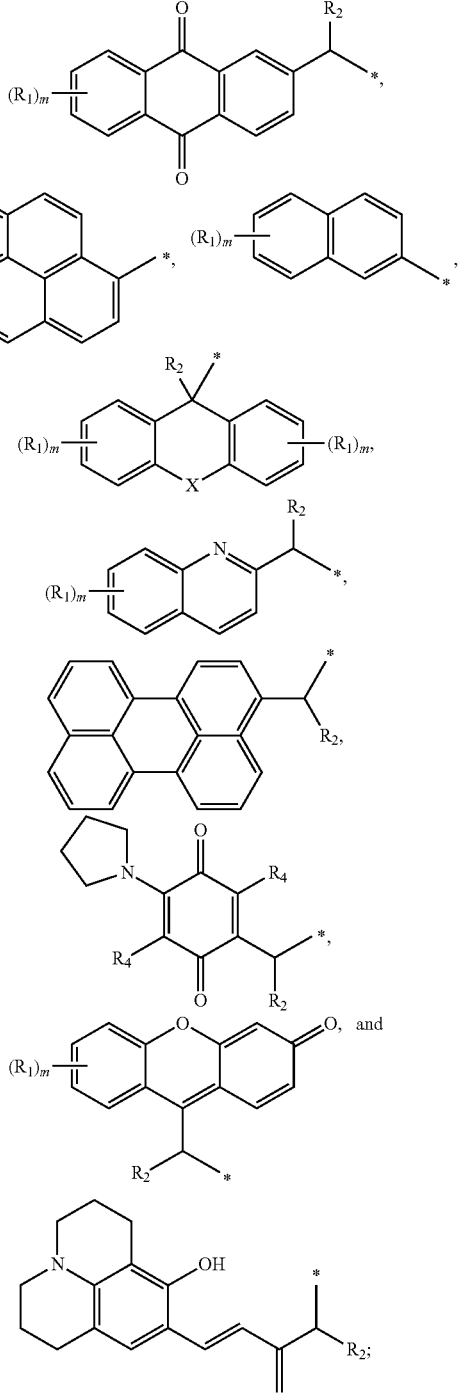

wherein * represents a bonding site;
each $R_1$ independently is selected from a group consisting of $C_{1-6}$ alkyl, $C_{1-6}$ haloalkyl, $C_{1-6}$ alkoxy, —OH, —SH, —COOH, halogen, substituted $C_{1-6}$ alkyl, substituted $C_{1-6}$ alkoxy, $C_{2-6}$ alkenyl, —CN, —NO$_2$, saturated or unsaturated 5 or 6-membered heterocyclic group containing at least one hetero atom, —N(R$_5$)$_2$, and aryl, wherein the heterocyclic group or the aryl is selectively substituted or unsubstituted with a functional group;
each $R_2$ independently is selected from a group consisting of hydrogen, $C_{1-6}$ alkyl, $C_{1-6}$ haloalkyl, $C_{1-6}$ alkoxy, —OH, —COOH, halogen, substituted $C_{1-6}$ alkyl, substituted $C_{1-6}$ alkoxy, $C_{2-6}$ alkenyl, —CN, —NO$_2$, and aryl, wherein the aryl is selectively substituted or unsubstituted with a functional group;

each $R_3$ independently is selected from a group consisting of $C_{1-6}$ alkyl, $C_{1-6}$ haloalkyl, and aryl, wherein the aryl is selectively substituted or unsubstituted with a functional group;

each $R_4$ independently is selected from a group consisting of $C_{1-6}$ alkyl, $C_{1-6}$ haloalkyl, halogen and —OH;

each $R_5$ independently is hydrogen or $C_{1-6}$ alkyl;

X is O or S;

n is an integer ranging from 0 to 5;

m is an integer ranging from 0 to 4;

l is an integer ranging from 0 to 3; and k is an integer ranging from 0 to 2;

$R_b$ is —Si(OR$_d$)$_3$, or

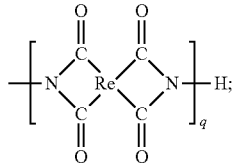

each $R_c$ independently is hydrogen or $C_{1-6}$ alkyl;

each $R_d$ independently is hydrogen or $C_{1-6}$ alkyl;

each $R_e$ independently is an aryl substituted or unsubstituted with a functional group;

p is an integer ranging from 1 to 5; and q is an integer ranging from 50 to 500.

In the present embodiment, regardless of the carrier 11 being a glass carrier, a quartz carrier, or a plastic carrier, the material of the debonding layer 12 can be formed on the carrier 11 through covalent bonds. In addition, when the carrier 11 used in the present embodiment is a plastic carrier, the material of the debonding layer 12 can be bonded onto the carrier 11 through the $R_b$ of the compound represented by the formula (I) or (II) by chemical modification.

In the present embodiment, the concentration of the material in the mixture for forming the debonding layer can be in a range from 0.01 wt % to 10 wt %, and the carrier 11 can be coated with the mixture through spin coating. However, in other embodiment, the material of the debonding layer 12 can be directly formed on the carrier 11 through deposition. In addition, the thickness of the debonding layer 12 is not particularly limited, and can be in a range from 100 Å to 2000 Å. However, in other embodiment, the debonding layer 12 can have other thickness beyond the aforementioned range.

Furthermore, in the material of the debonding layer 12 of the present embodiment, the $R_a$ of the compound represented by the formula (I) or (II) can be selected from a group consisting of:

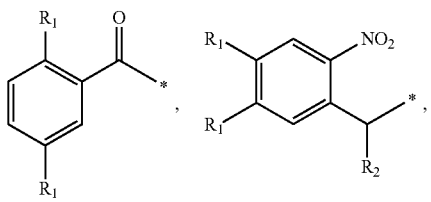

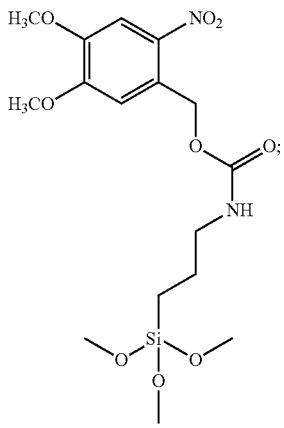 [SMILES: COc1cc(COC(=O)NCCC[Si](OC)(OC)OC)c([N+](=O)[O-])cc1OC]

wherein each $R_1$ independently is selected from a group consisting of methyl, ethyl, propyl, methoxy, ethyoxy, propoxy, —CH$_2$F, —CHF$_2$, —CF$_3$, —OH, —COOH, —F, —Cl, —Br, —NO$_2$, and —N(R$_5$)$_2$; each $R_2$ independently is selected from a group consisting of hydrogen, methyl, ethyl, propyl, methoxy, ethyoxy, propoxy, —CH$_2$F, —CHF$_2$, —CF$_3$, —OH, —F, —Cl, —Br, and —NO$_2$; and each $R_5$ independently is hydrogen, methyl, ethyl, or propyl.

More particularly, the material of the debonding layer 12 used in the present embodiment is:

but the present invention is not particularly limited to this compound in other embodiments.

Figure 1B:
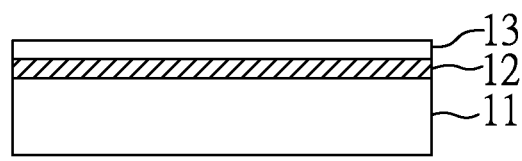

Next, as shown in FIG. 1A and FIG. 1B, a substrate 13 is laminated on the debonding layer 12 to make the debonding layer 12 dispose between the carrier 11 and the substrate 13, wherein the substrate 13 has a first surface 131 and a second surface 132 corresponding to each other, and the second surface 132 contacts the debonding layer 12. Herein, the substrate 13 can be laminated on the carrier 11 with the debonding layer 12 formed thereon through any manner known in the art, such as lamination or adhering process. Alternatively, the material for forming the substrate 13 can be firstly formed on the carrier 11 with the debonding layer 12 by spin coating, and then a substrate 13 can be obtained after a curing process. In the present invention, the substrate 13 is preferably laminated on the carrier 11 with the debonding layer 12 through the adhering process.

Herein, the substrate 13 can be any flexible substrate generally used in the art, and featured to have a bending displacement of more than 80 mm. For example, the flexible substrate can be a thin glass substrate having a thickness in a range from 0.1 mm to 0.3 mm, a polymer substrate, a polymer-metal composite substrate, or a polymer-metal oxide composite substrate, wherein the polymer is PI, PA, PMMA, or a combination thereof.

Figure 1C:
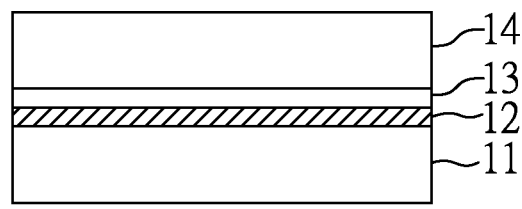

Then, as shown in FIG. 1C, an electronic unit layer 14 is formed on the substrate 13 through a known process used in the art. The electronic unit layer 14 can comprise the electronic units generally used in the art, such as a display unit, a thin film transistor unit, and a touch unit, and the aforementioned electronic units can be used alone or together to form the electronic unit layer 14. Herein, the known display unit in the art can be a liquid crystal display unit or an organic light emitting diode display unit.

Figure 1D:
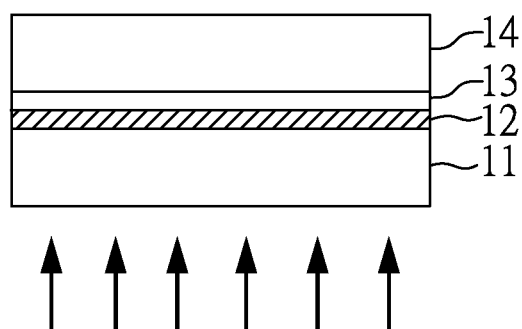
Figure 1E:
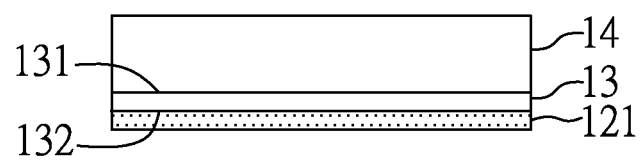

As shown in FIG. 1D, a radiation is performed on a side of the carrier 11 to react the material of the debonding layer 12 to separate the substrate 13 from the carrier. Thus, an electronic apparatus is obtained, as shown in FIG. 1E.

More specifically, as shown in FIG. 1D, the radiation is provided from the backside of the carrier 11. In the present embodiment, the radiation is provided from the carrier 11 without the debonding layer 12 formed thereon, and the light penetrates through the carrier 11 and achieves the debonding layer 12 to perform a photo-reaction (or, photo-cleavage) on the material thereof. Thus, the substrate 13 can be separated from the carrier, as shown in FIG. 1E.

In the present embodiment, when an UV light source is used as the radiation, the light absorbing group ($R_a$) of the material of the debonding layer 12 is excited to perform the cleavage reaction, and the generated derivative after the cleavage reaction is remained on the second surface 132 of the substrate 13 to form a residue layer 121, wherein the residue layer 121 is disposed on the second surface 132 of the substrate 13 through a van der Waals' force, a hydrogen bond, or a π-π interaction. Herein, the wavelength, the light intensity, and the radiation time can be selected according to the material of the debonding layer 12. Preferably, the wavelength of the UV light can be in a range from 200 nm to 420 nm, and the accumulated amount of the light can be in a range from 1 J to 60 J. However, the radiation conditions used in the other embodiments of the present invention are not limited to the aforementioned ranges. Therefore, the material of the obtained residue layer comprises: a compound containing at least one selected from a group consisting of aryl, nitro and ketone; and comprises: at least one derivative of a material represented by the aforementioned formula (I) or (II) obtained after a radiation.

Preferably, the material of the residue layer 121 of the present embodiment comprises: at least one compound selected from a group consisting of:

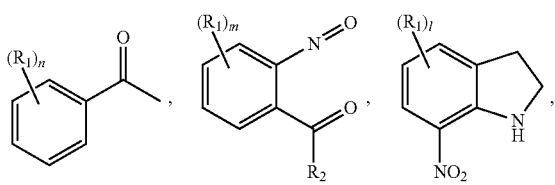

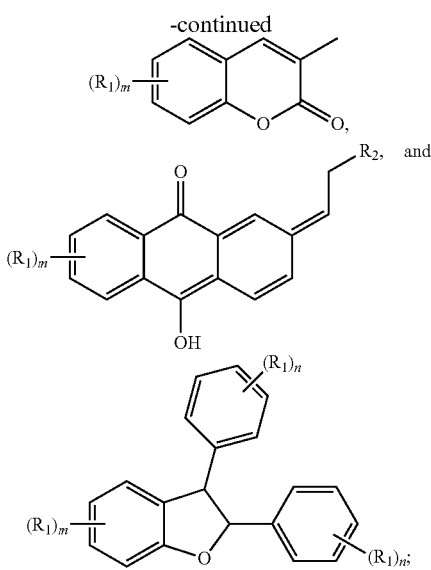

wherein each $R_1$ independently is selected from a group consisting of methyl, ethyl, propyl, methoxy, ethyoxy, propoxy, —$CH_2F$, —$CHF_2$, —$CF_3$, —OH, —COOH, —F, —Cl, —Br, —$NO_2$, and —$N(R_5)_2$; each $R_2$ independently is selected from a group consisting of hydrogen, methyl, ethyl, propyl, methoxy, ethyoxy, propoxy, —$CH_2F$, —$CHF_2$, —$CF_3$, —OH, —F, —Cl, —Br, and —$NO_2$; and each $R_5$ independently is hydrogen, methyl, ethyl, or propyl.

More specifically, the material of the residue layer 121 obtained in the present embodiment is:

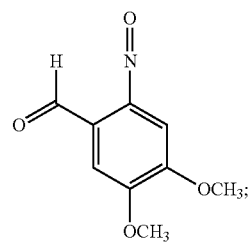 [SMILES: COc1cc(C=O)c(N=O)cc1OC]

but the present invention is not particularly limited to this compound in other embodiments.

After the aforementioned process, the electronic apparatus of the present embodiment can be obtained, as shown in FIG. 1E. The electronic apparatus of the present embodiment comprises: a substrate 13 with a first surface 131 and a second surface 132 corresponding to each other; an electronic unit layer 14 disposed on the first surface 131 of the substrate 13; and a residue layer 121 disposed on the second surface 132 of the substrate 13, wherein a material of the residue layer 121 comprises: at least one derivative of a material represented by the aforementioned formula (I) or (II) obtained after a radiation.

In addition, the electronic apparatus obtained in the present embodiment can also be applied to various display panels, such as liquid crystal display (LED) panel or organic light emitting diode display (OLED) panel. Furthermore, the obtained display panel can further be applied to various electronic devices, such as cell phones, notebooks, video cameras, cameras, music players, navigation devices, and televisions.

Although the present invention has been explained in relation to its preferred embodiment, it is to be understood that many other possible modifications and variations can be made without departing from the spirit and scope of the invention as hereinafter claimed.

What is claimed is:

1. An electronic apparatus, comprising:
a substrate with a first surface and a second surface corresponding to each other;
an electronic unit layer disposed on the first surface of the substrate; and
a residue layer disposed on the second surface of the substrate, wherein a material of the residue layer comprises: a compound containing at least one selected from a group consisting of aryl, nitro and ketone;
wherein the material of the residue layer comprises: at least one derivative of a material represented by the following formula (I) or (II) obtained after a radiation:

$$R_a-Z_1-\overset{O}{\underset{\|}{C}}-Z_2+CH_2\xrightarrow{}_p R_b \quad (I)$$

$$R_a-Z_3+CH_2\xrightarrow{}_p R_b \quad (II)$$

wherein $Z_1$ is selected from a group consisting of O, S, N, $C(R_c)_2$, and a bond;
$Z_2$ is selected from a group consisting of O, S, and N;
$Z_3$ is $HPO_3$ or $SO_3$;
$R_a$ is selected from a group consisting of:

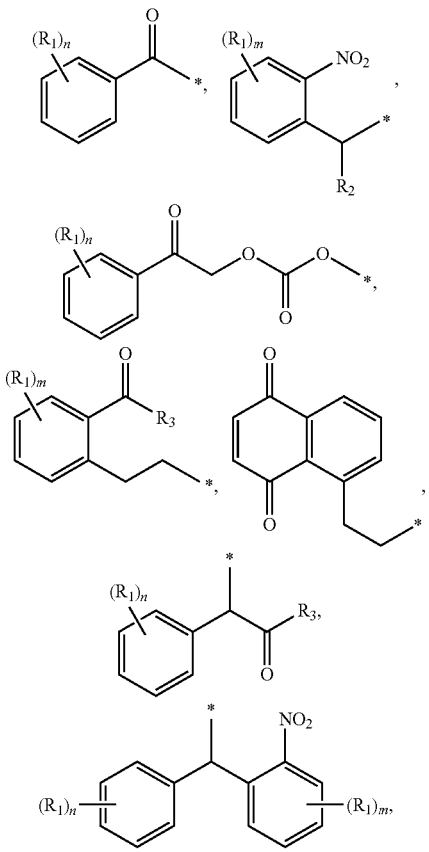

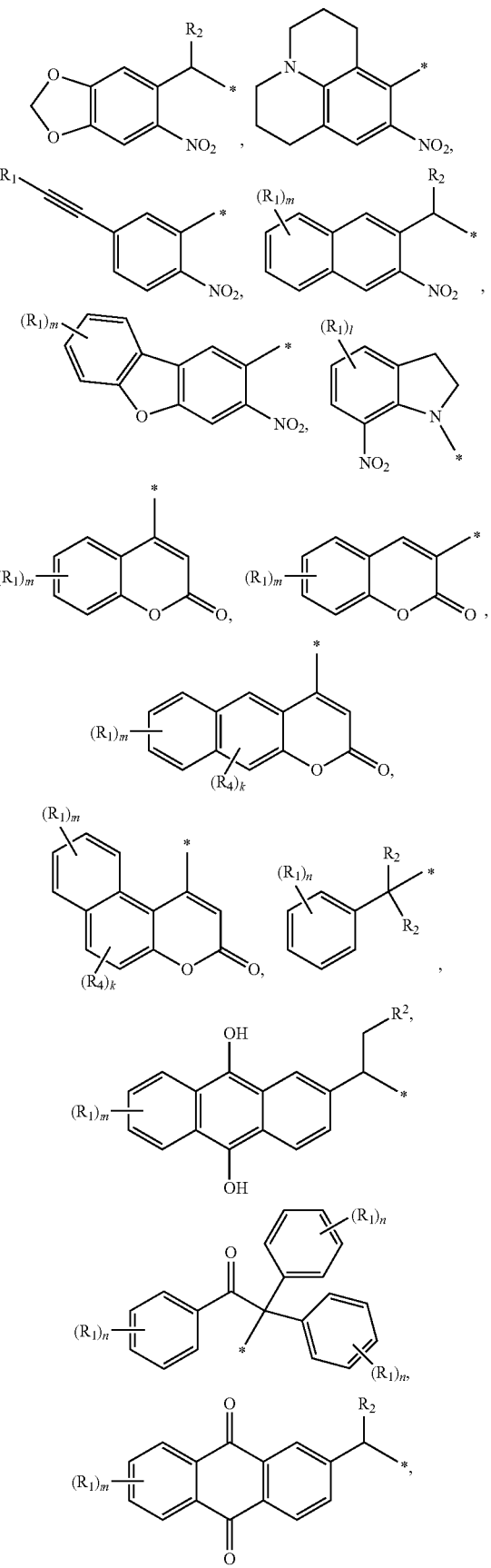

-continued

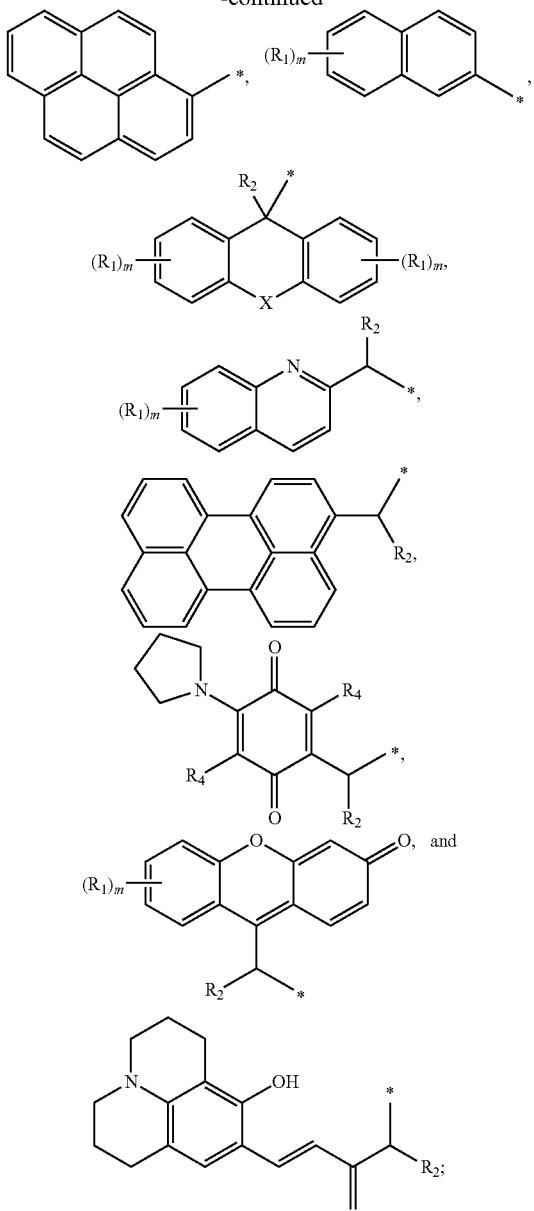

wherein * represents a bonding site;
each $R_1$ independently is selected from a group consisting of $C_{1-6}$ alkyl, $C_{1-6}$ haloalkyl, $C_{1-6}$ alkoxy, —OH, —SH, —COOH, halogen, substituted $C_{1-6}$ alkyl, substituted $C_{1-6}$ alkoxy, $C_{2-6}$ alkenyl, —CN, —NO$_2$, saturated or unsaturated 5 or 6-membered heterocyclic group containing at least one hetero atom, —N(R$_5$)$_2$, and aryl, wherein the heterocyclic group or the aryl is selectively substituted or unsubstituted with a functional group;
each $R_2$ independently is selected from a group consisting of hydrogen, $C_{1-6}$ alkyl, $C_{1-6}$ haloalkyl, $C_{1-6}$ alkoxy, —OH, —COOH, halogen, substituted $C_{1-6}$ alkyl, substituted $C_{1-6}$ alkoxy, $C_{2-6}$ alkenyl, —CN, —NO$_2$, and aryl, wherein the aryl is selectively substituted or unsubstituted with a functional group;
each $R_3$ independently is selected from a group consisting of $C_{1-6}$ alkyl, $C_{1-6}$ haloalkyl, and aryl, wherein the aryl is selectively substituted or unsubstituted with a functional group;
each $R_4$ independently is selected from a group consisting of $C_{1-6}$ alkyl, $C_{1-6}$ haloalkyl, halogen and —OH;
each $R_5$ independently is hydrogen or $C_{1-6}$ alkyl;
X is O or S;
n is an integer ranging from 0 to 5;
m is an integer ranging from 0 to 4;
l is an integer ranging from 0 to 3; and
k is an integer ranging from 0 to 2;
$R_b$ is —Si(OR$_d$)$_3$, or

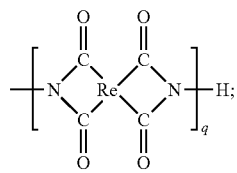

each $R_c$ independently is hydrogen or $C_{1-6}$ alkyl;
each $R_d$ independently is hydrogen or $C_{1-6}$ alkyl;
each $R_e$ independently is an aryl substituted or unsubstituted with a functional group;
p is an integer ranging from 1 to 5; and
q is an integer ranging from 50 to 500.

2. The electronic apparatus as claimed in claim 1, wherein a bending displacement of the substrate is more than 80 mm.

3. The electronic apparatus as claimed in claim 1, wherein the substrate is a thin glass substrate, a polymer substrate, a polymer-metal composite substrate, or a polymer-metal oxide composite substrate.

4. The electronic apparatus as claimed in claim 1, wherein the electronic unit layer is a display unit, a thin film transistor unit, a touch unit, or a combination thereof.

5. The electronic apparatus as claimed in claim 1, wherein the radiation is an UV light radiation.

6. The electronic apparatus as claimed in claim 5, wherein a wavelength of the radiation is in a range from 200 nm to 420 nm.

7. The electronic apparatus as claimed in claim 1, wherein the residue layer is disposed on the second surface of the substrate through a van der Waals' force, a hydrogen bond, or a π-π interaction.

8. An electronic apparatus, comprising:
a substrate with a first surface and a second surface corresponding to each other;
an electronic unit layer disposed on the first surface of the substrate; and
a residue layer disposed on the second surface of the substrate, wherein a material of the residue layer comprises: a compound containing at least one selected from a group consisting of aryl, nitro and ketone;
wherein the material of the residue layer comprises: at least one compound selected from a group consisting of:

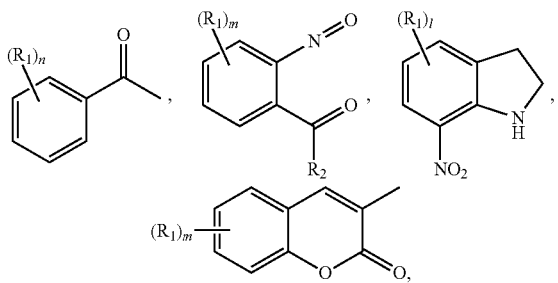

-continued

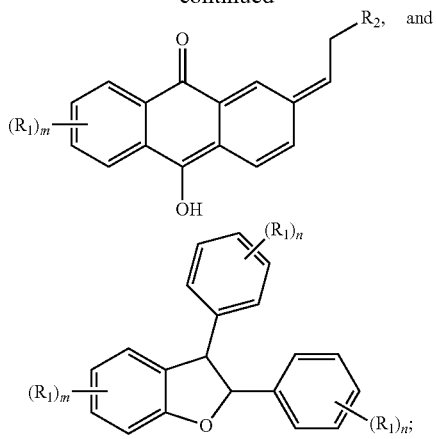

wherein each $R_1$ independently is selected from a group consisting of $C_{1-6}$ alkyl, $C_{1-6}$ haloalkyl, $C_{1-6}$ alkoxy, —OH, —SH, —COOH, halogen, substituted $C_{1-6}$ alkyl, substituted $C_{1-6}$ alkoxy, $C_{2-6}$ alkenyl, —CN, —NO$_2$, saturated or unsaturated 5 or 6-membered heterocyclic group containing at least one hetero atom, —N(R$_5$)$_2$, and aryl, wherein the heterocyclic group or the aryl is selectively substituted or unsubstituted with a functional group;

each $R_2$ independently is selected from a group consisting of hydrogen, $C_{1-6}$ alkyl, $C_{1-6}$ haloalkyl, $C_{1-6}$ alkoxy, —OH, —COOH, halogen, substituted $C_{1-6}$ alkyl, substituted $C_{1-6}$ alkoxy, $C_{2-6}$ alkenyl, —CN, —NO$_2$, and aryl, wherein the aryl is selectively substituted or unsubstituted with a functional group;

each $R_5$ independently is hydrogen or $C_{1-6}$ alkyl;

n is an integer ranging from 0 to 5;

m is an integer ranging from 0 to 4; and l is an integer ranging from 0 to 3.

9. A method for manufacturing an electronic apparatus, comprising the following steps:

(A) providing a carrier with a debonding layer formed thereon, wherein a material of the debonding layer comprises: a siloxane compound or a polyimide compound containing at least one selected from a group consisting of aryl, nitro and ketone;

(B) disposing a substrate on the debonding layer to let the debonding layer locate between the substrate and the carrier, wherein the substrate has a first surface and a second surface corresponding to each other, and the second surface contacts the debonding layer;

(C) forming an electronic unit layer on the first surface of the substrate; and (D) providing a radiation from a side of the carrier to separate the carrier from the substrate through a reaction of the material of the debonding layer to form an electronic apparatus, wherein the debonding layer is converted into a residue layer forming on the second surface of the substrate, and a material of the residue layer comprises: a compound containing at least one selected from a group consisting of aryl, nitro and ketone; and (E) wherein the material of the debonding layer comprises: at least one compound represented by the following formula (I) or (II):

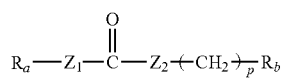

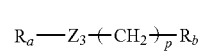

wherein $Z_1$ is selected from a group consisting of O, S, N, C(R$_c$)$_2$, and a bond;

$Z_2$ is selected from a group consisting of O, S, and N;

$Z_3$ is HPO$_3$ or SO$_3$;

$R_a$ is selected from a group consisting of:

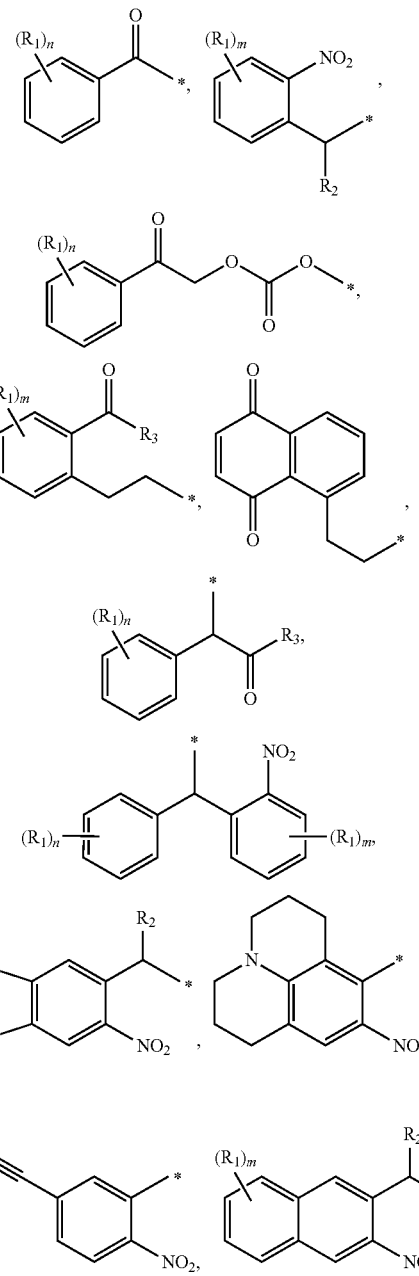

-continued

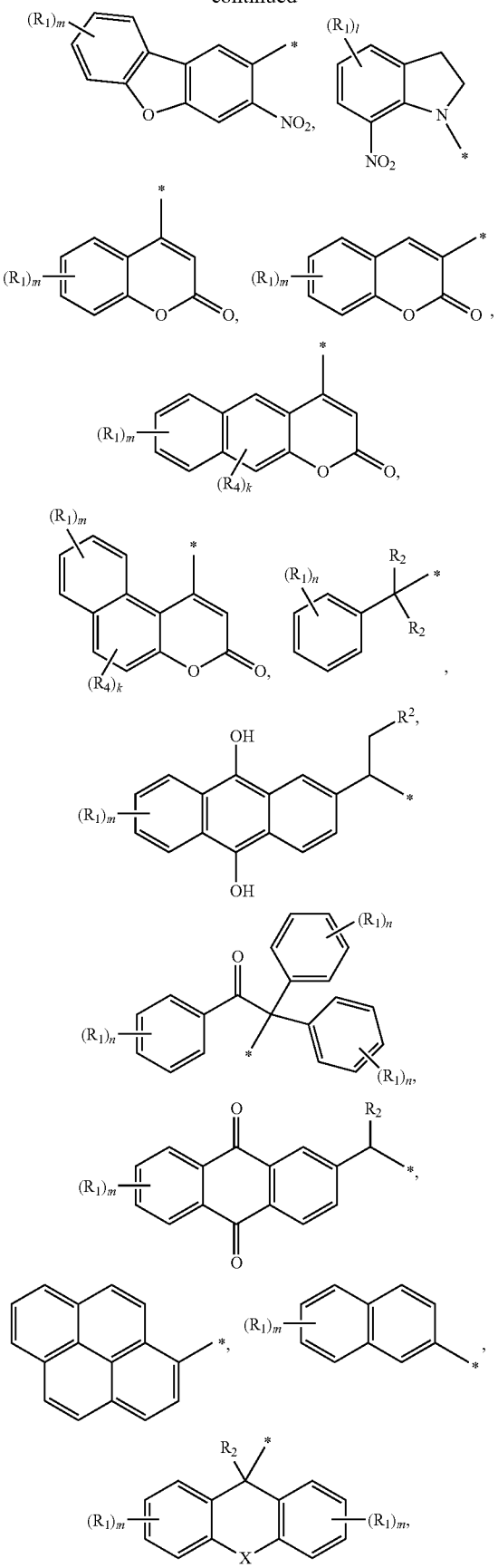

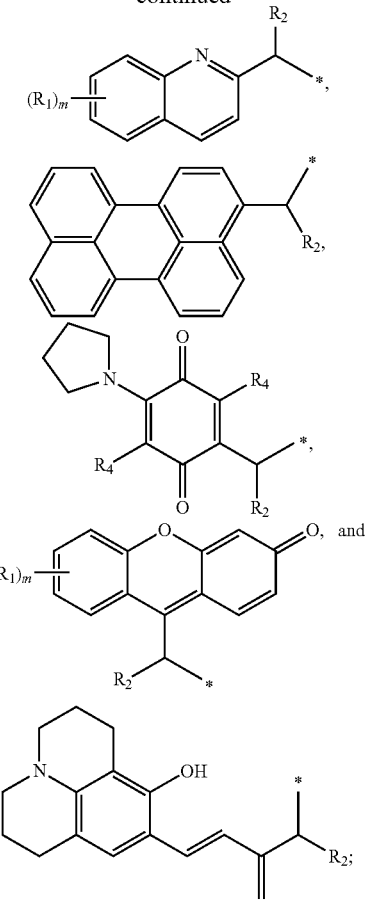

wherein * represents a bonding site;

each $R_1$ independently is selected from a group consisting of $C_{1-6}$ alkyl, $C_{1-6}$ haloalkyl, $C_{1-6}$ alkoxy, —OH, —SH, —COOH, halogen, substituted $C_{1-6}$ alkyl, substituted $C_{1-6}$ alkoxy, $C_{2-6}$ alkenyl, —CN, —NO$_2$, saturated or unsaturated 5 or 6-membered heterocyclic group containing at least one hetero atom, —N(R$_5$)$_2$, and aryl, wherein the heterocyclic group or the aryl is selectively substituted or unsubstituted with a functional group;

each $R_2$ independently is selected from a group consisting of hydrogen, $C_{1-6}$ alkyl, $C_{1-6}$ haloalkyl, $C_{1-6}$ alkoxy, —OH, —COOH, halogen, substituted $C_{1-6}$ alkyl, substituted $C_{1-6}$ alkoxy, $C_{2-6}$ alkenyl, —CN, —NO$_2$, and aryl, wherein the aryl is selectively substituted or unsubstituted with a functional group;

each $R_3$ independently is selected from a group consisting of $C_{1-6}$ alkyl, $C_{1-6}$ haloalkyl, and aryl, wherein the aryl is selectively substituted or unsubstituted with a functional group;

each $R_4$ independently is selected from a group consisting of $C_{1-6}$ alkyl, $C_{1-6}$ haloalkyl, halogen and —OH;

each $R_5$ independently is hydrogen or $C_{1-6}$ alkyl;

X is O or S;

n is an integer ranging from 0 to 5;

m is an integer ranging from 0 to 4;

l is an integer ranging from 0 to 3; and k is an integer ranging from 0 to 2;

$R_b$ is —Si(OR$_d$)$_3$, or

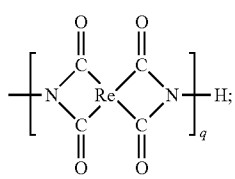

each $R_c$ independently is hydrogen or $C_{1-6}$ alkyl;
each $R_d$ independently is hydrogen or $C_{1-6}$ alkyl;
each $R_e$ independently is an aryl substituted or unsubstituted with a functional group;
p is an integer ranging from 1 to 5; and
q is an integer ranging from 50 to 500.

10. The method as claimed in claim 9, wherein the material of the residue layer comprises: at least one compound selected from a group consisting of:

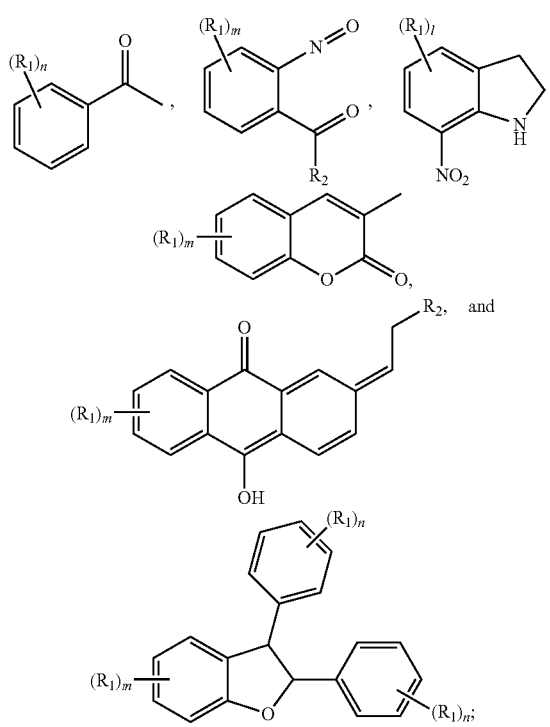

wherein each $R_1$ independently is selected from a group consisting of $C_{1-6}$ alkyl, $C_{1-6}$ haloalkyl, $C_{1-6}$ alkoxy, —OH, —SH, —COON, halogen, substituted $C_{1-6}$ alkyl, substituted $C_{1-6}$ alkoxy $C_{2-6}$ alkenyl, —CN, —NO$_2$, saturated or unsaturated 5 or 6-membered heterocyclic group containing at least one hetero atom, —N(R$_5$)$_2$, and aryl, wherein the heterocyclic group or the aryl is selectively substituted or unsubstituted with a functional group;
    each $R_2$ independently is selected from a group consisting of hydrogen, $C_{1-6}$ alkyl, $C_{1-6}$ haloalkyl, $C_{1-6}$ alkoxy, —OH, —COON, halogen, substituted $C_{1-6}$ alkyl, substituted $C_{1-6}$ alkoxy, $C_{2-6}$ alkenyl, —CN, —NO$_2$, and aryl, wherein the aryl is selectively substituted or unsubstituted with a functional group;
    each $R_5$ independently is hydrogen or $C_{1-6}$ alkyl;
    n is an integer ranging from 0 to 5;
    m is an integer ranging from 0 to 4; and
    l is an integer ranging from 0 to 3.

11. The method as claimed in claim 9, wherein $R_a$ is selected from a group consisting of:

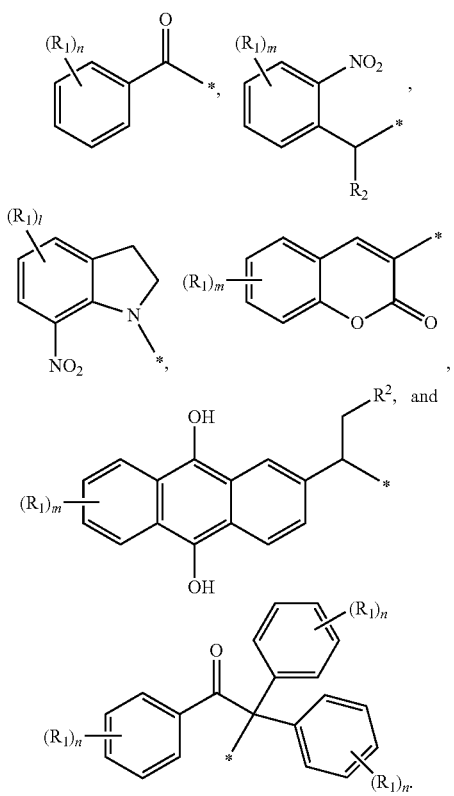

12. The method as claimed in claim 9, wherein a bending displacement of the substrate is more than 80 mm.

13. The method as claimed in claim 9, wherein the substrate is a thin glass substrate, a polymer substrate, a polymer-metal composite substrate, or a polymer-metal oxide composite substrate.

14. The method as claimed in claim 9, wherein the electronic unit layer is a display unit, a thin film transistor unit, a touch unit, or a combination thereof.

15. The method as claimed in claim 9, wherein the radiation is an UV light radiation.

16. The method as claimed in claim 9, wherein a wavelength of the radiation is in a range from 200 nm to 420 nm.

17. The method as claimed in claim 9, wherein the carrier has a light transmittance larger than 30%.

18. The method as claimed in claim 9, wherein the carrier is a glass carrier, a quartz carrier, or a plastic carrier.

* * * * *